US011050015B2

(12) United States Patent
Ito

(10) Patent No.: US 11,050,015 B2
(45) Date of Patent: Jun. 29, 2021

(54) STORAGE DEVICE AND METHOD FOR MANUFACTURING STORAGE DEVICE

(71) Applicant: Toshiba Memory Corporation, Tokyo (JP)

(72) Inventor: Yuichi Ito, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 98 days.

(21) Appl. No.: 16/290,622

(22) Filed: Mar. 1, 2019

(65) Prior Publication Data

US 2020/0091409 A1    Mar. 19, 2020

(30) Foreign Application Priority Data

Sep. 14, 2018  (JP) ............................. JP2018-173091

(51) Int. Cl.

| H01L 43/02 | (2006.01) |
|---|---|
| H01L 27/22 | (2006.01) |
| G11C 11/18 | (2006.01) |
| H01F 41/34 | (2006.01) |
| G11C 11/16 | (2006.01) |
| H01L 43/12 | (2006.01) |
| H01L 45/00 | (2006.01) |
| H01F 10/32 | (2006.01) |

(52) U.S. Cl.
CPC ............ *H01L 43/02* (2013.01); *G11C 11/161* (2013.01); *H01F 10/3254* (2013.01); *H01F 41/34* (2013.01); *H01L 27/224* (2013.01); *H01L 43/12* (2013.01); *H01L 45/1233* (2013.01); *H01L 45/141* (2013.01); *H01L 45/1608* (2013.01)

(58) Field of Classification Search
CPC combination set(s) only.
See application file for complete search history.

(56) References Cited

U.S. PATENT DOCUMENTS

| 8,716,819 | B2 | 5/2014 | Kitagawa et al. |
|---|---|---|---|
| 8,987,696 | B2 | 3/2015 | Sonehara et al. |
| 9,203,021 | B2 | 12/2015 | Sonehara |
| 2013/0168628 | A1 | 7/2013 | Hwang |
| 2014/0008602 | A1 | 1/2014 | Karpov et al. |
| 2015/0123066 | A1 | 5/2015 | Gealy et al. |
| 2015/0263068 | A1* | 9/2015 | Ito .......................... G11C 11/161 365/158 |
| 2016/0379698 | A1* | 12/2016 | Saida ...................... H01L 43/10 365/158 |
| 2020/0066790 | A1* | 2/2020 | Lassalle-Balier ....... H01L 43/08 |

* cited by examiner

*Primary Examiner* — Mounir S Amer
(74) *Attorney, Agent, or Firm* — Kim & Stewart LLP

(57) ABSTRACT

A storage device includes a first conductor that extends in a first direction, a first stacked body that extends in the first direction, is electrically connected to the first conductor, and includes a first ferromagnetic body that extends in the first direction, a second ferromagnetic body, a first insulator between the first stacked body and the second ferromagnetic body, a first switching element having first and second ends, wherein the first end is electrically connected to the second ferromagnetic body, the first switching element regulating current flow between the first and second ends in response to a voltage applied between the first and second ends, a second conductor that extends in a second direction crossing the first direction and is electrically connected to the second end of the first switching element, a third ferromagnetic body, and a second insulator between the third ferromagnetic body and another stacked body.

10 Claims, 27 Drawing Sheets

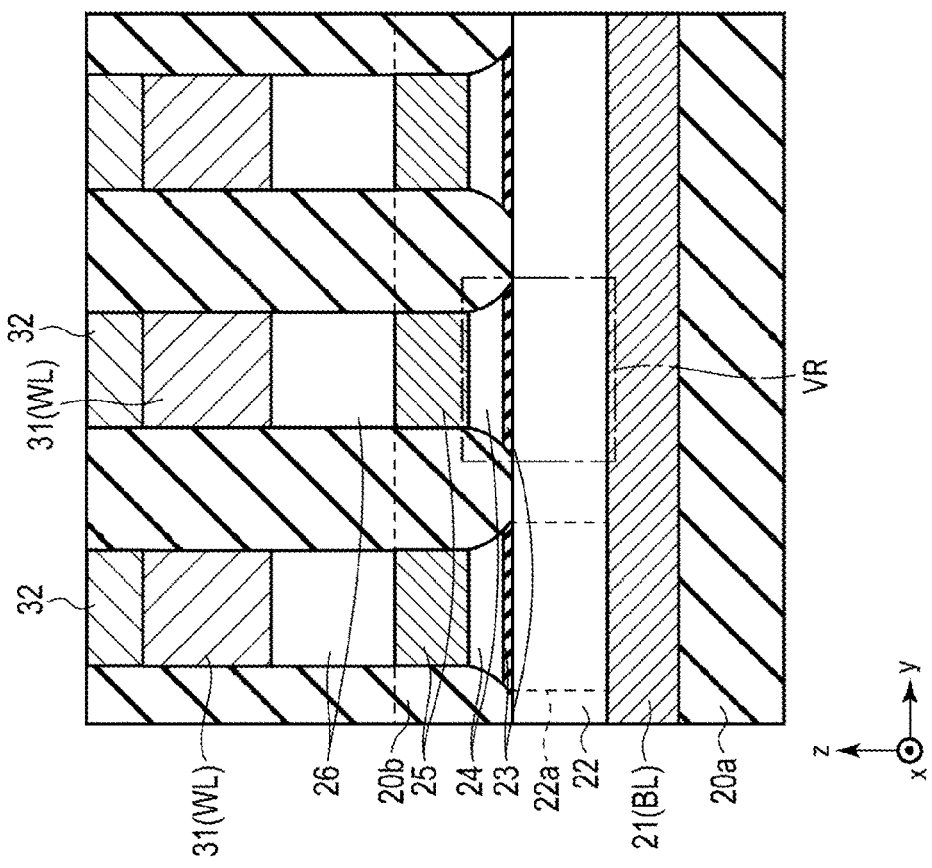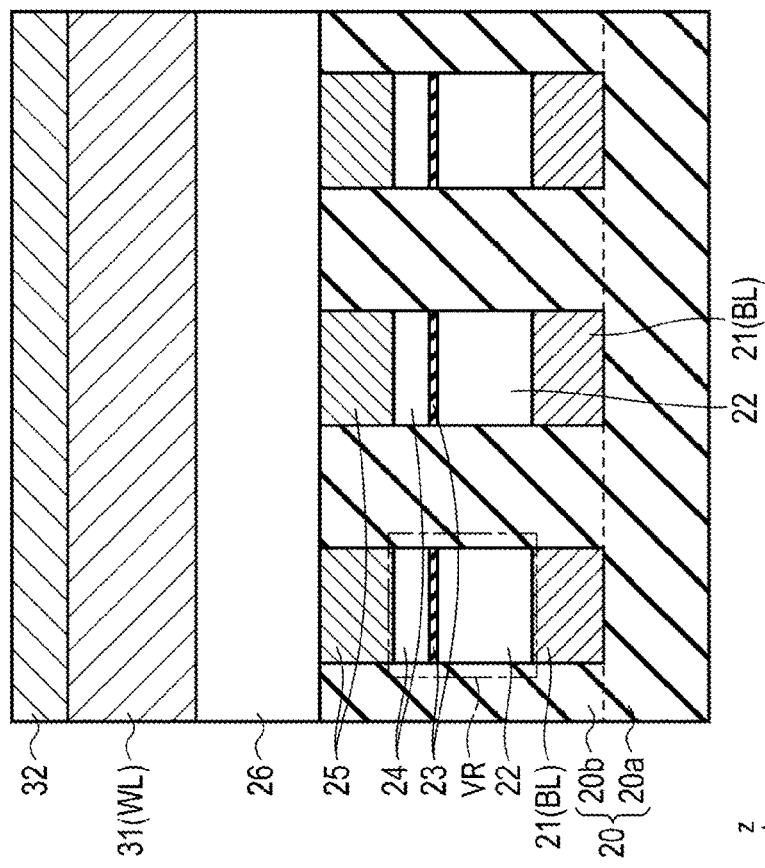

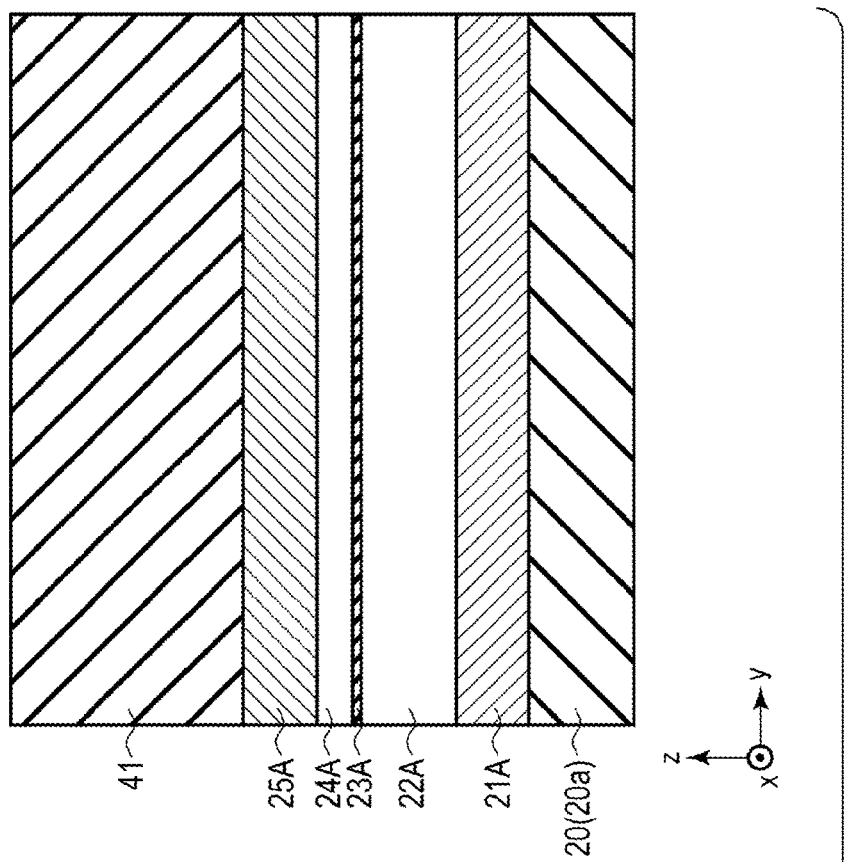
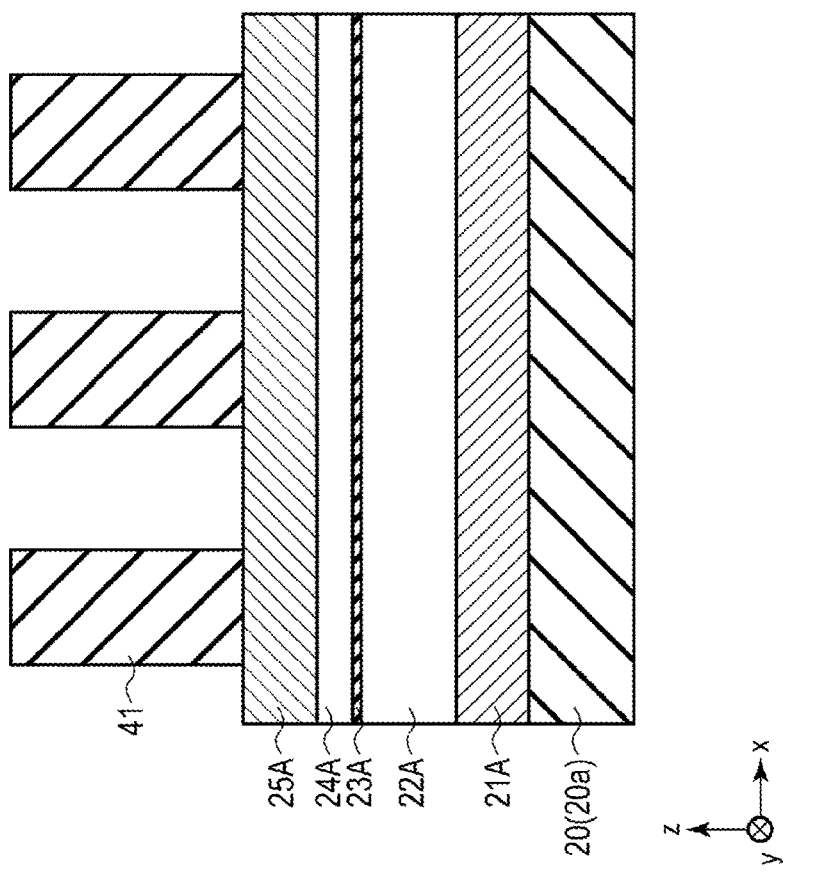

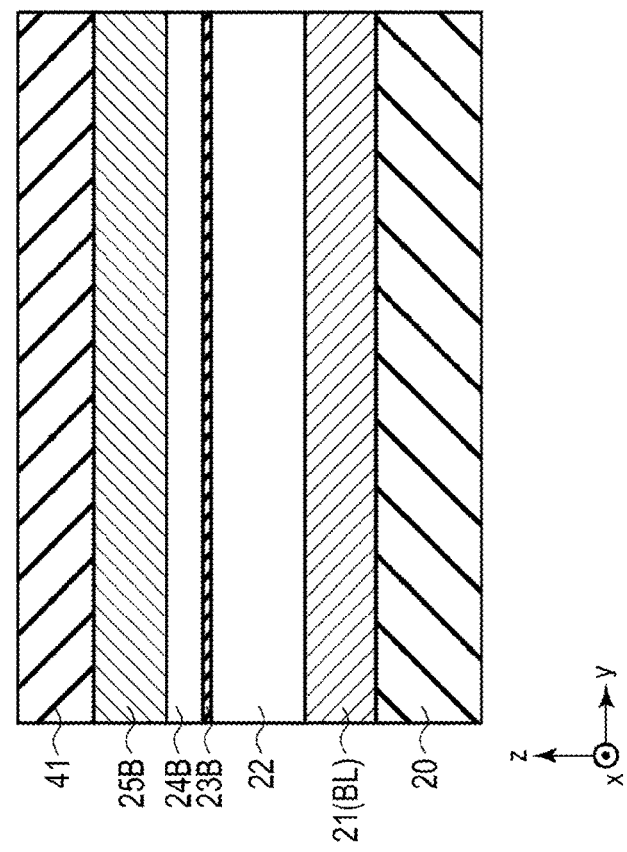
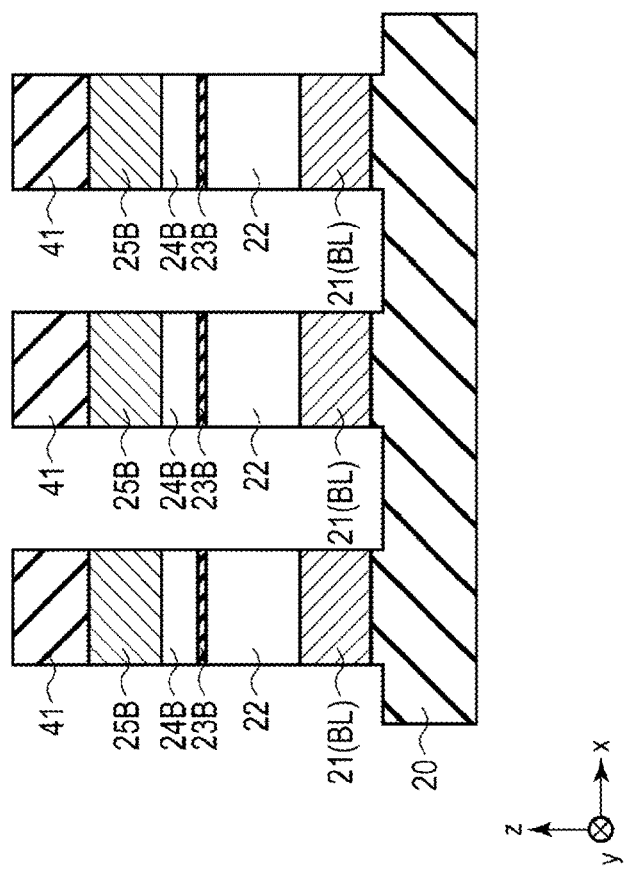

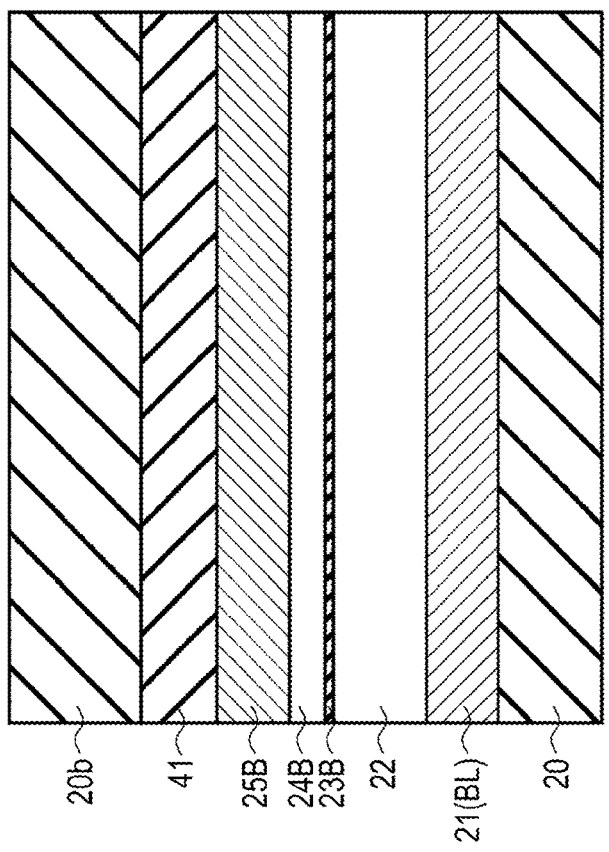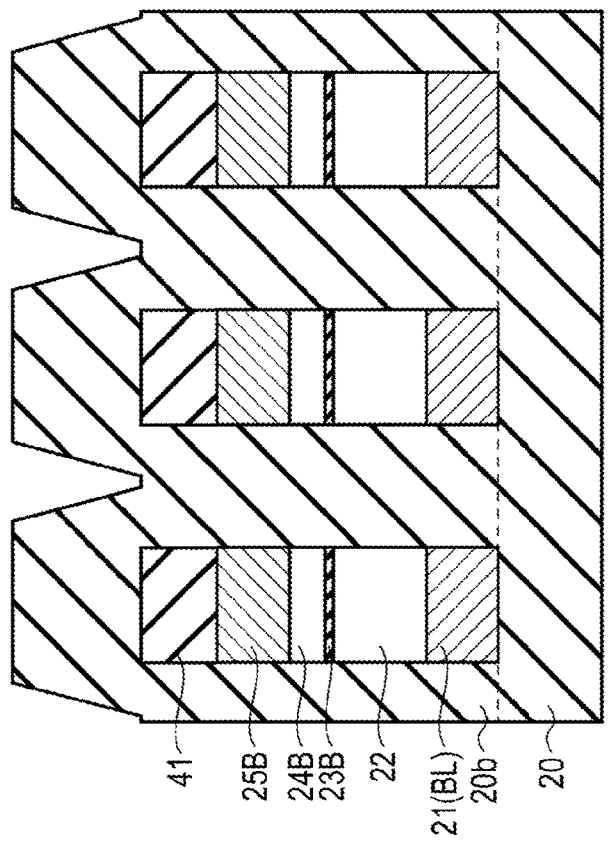

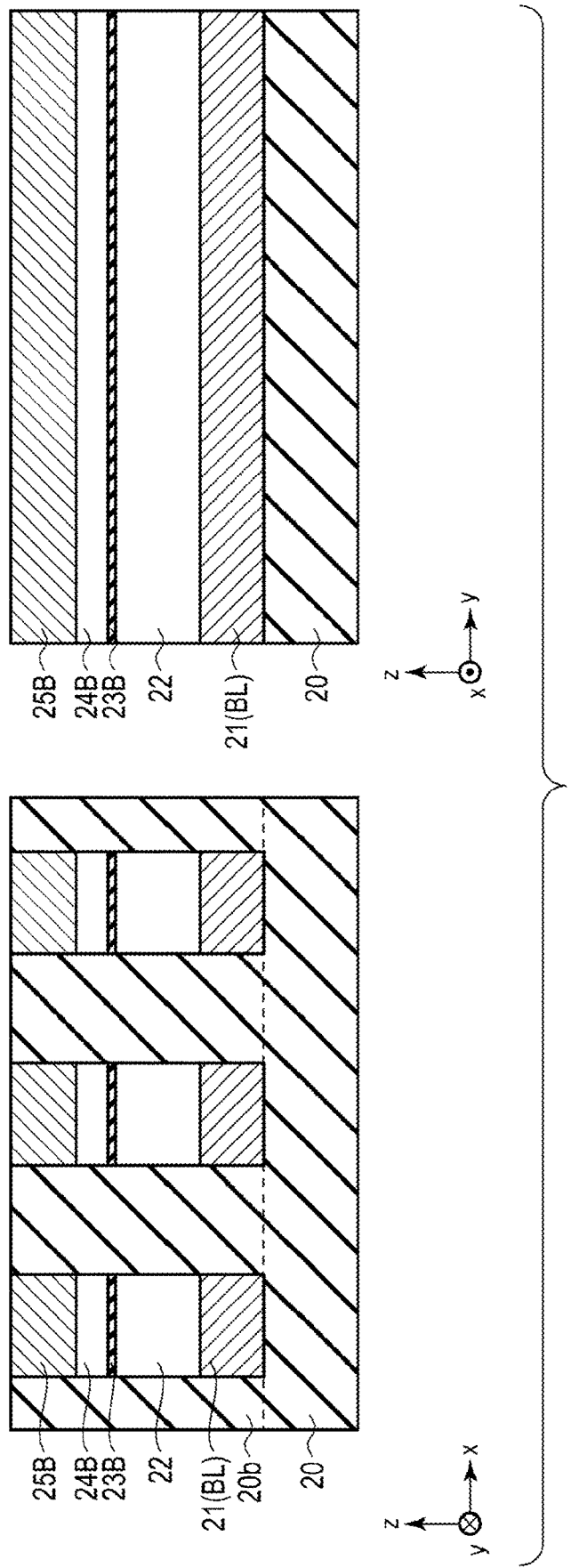

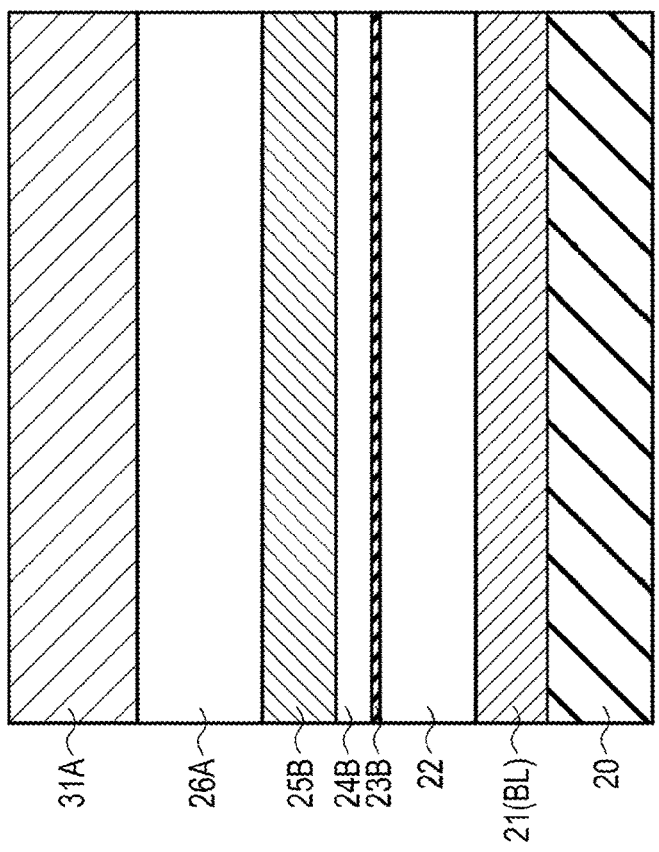
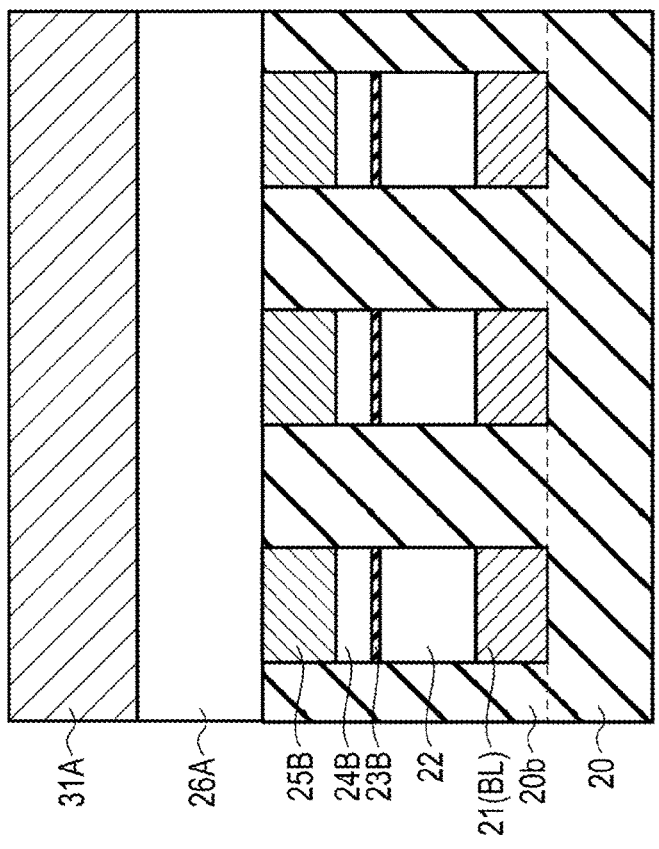

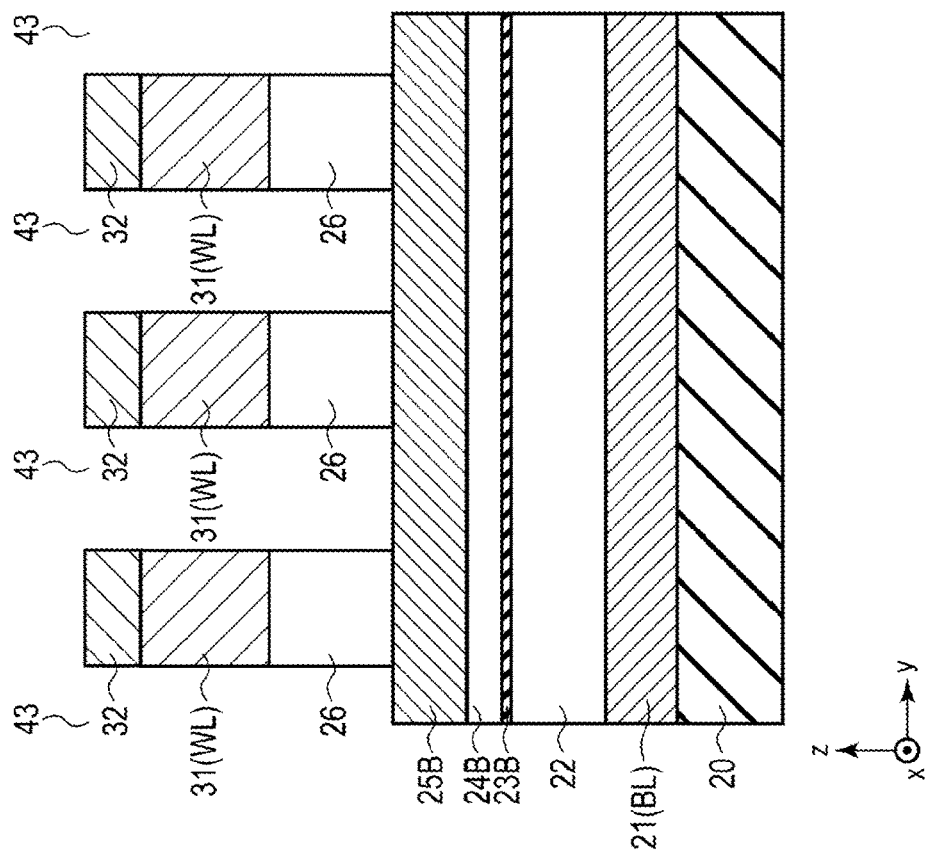
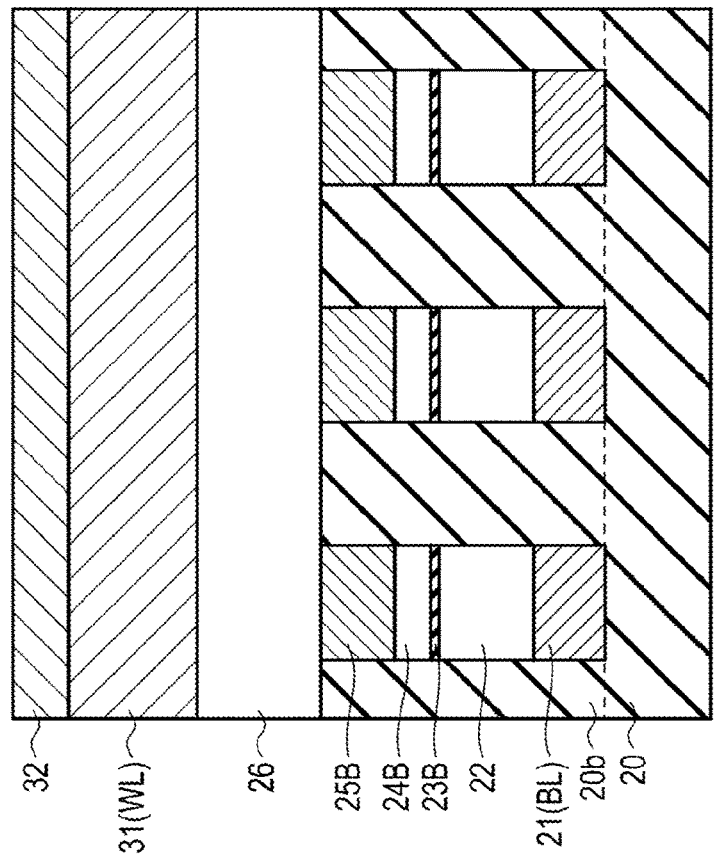
FIG. 13A
FIG. 13B

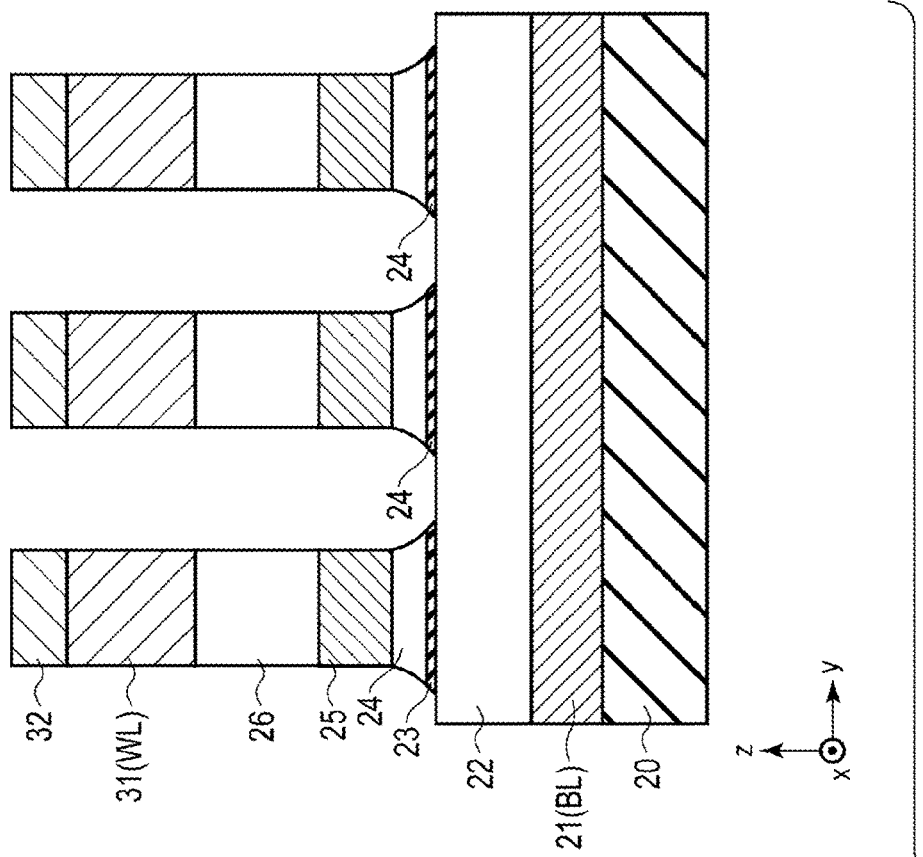
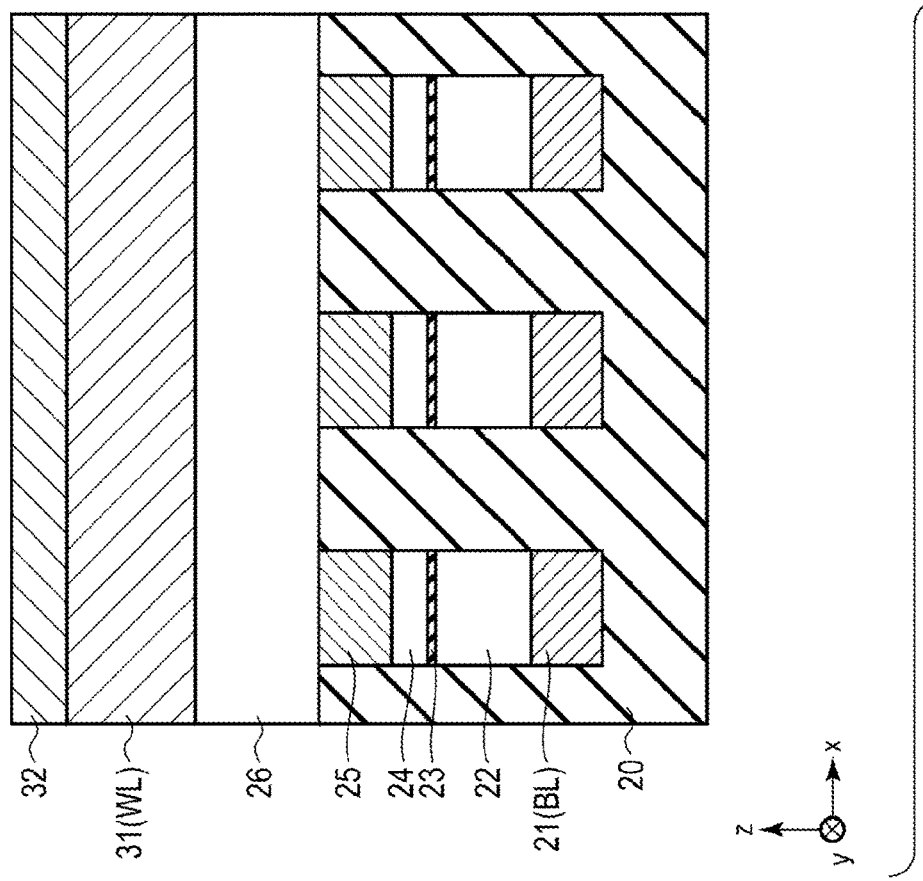

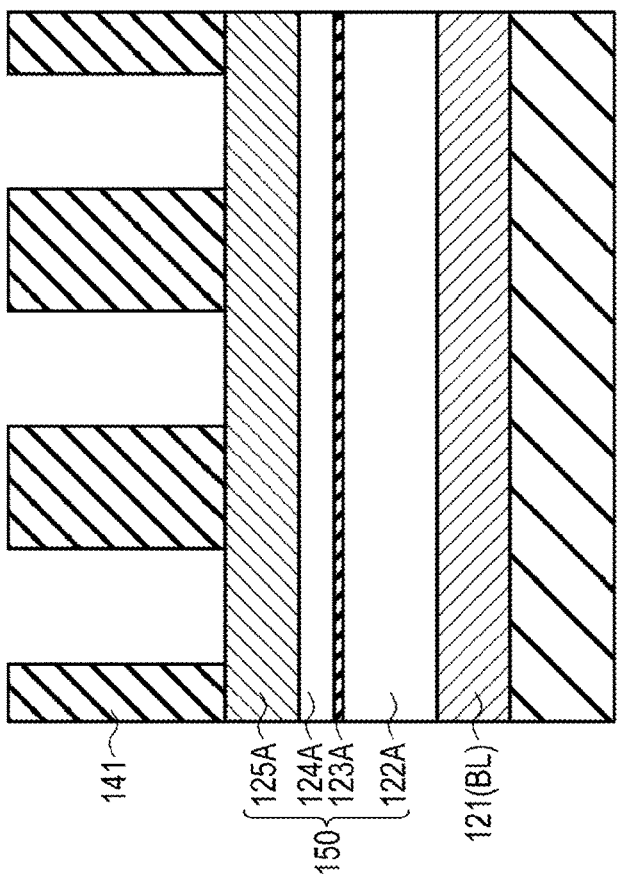
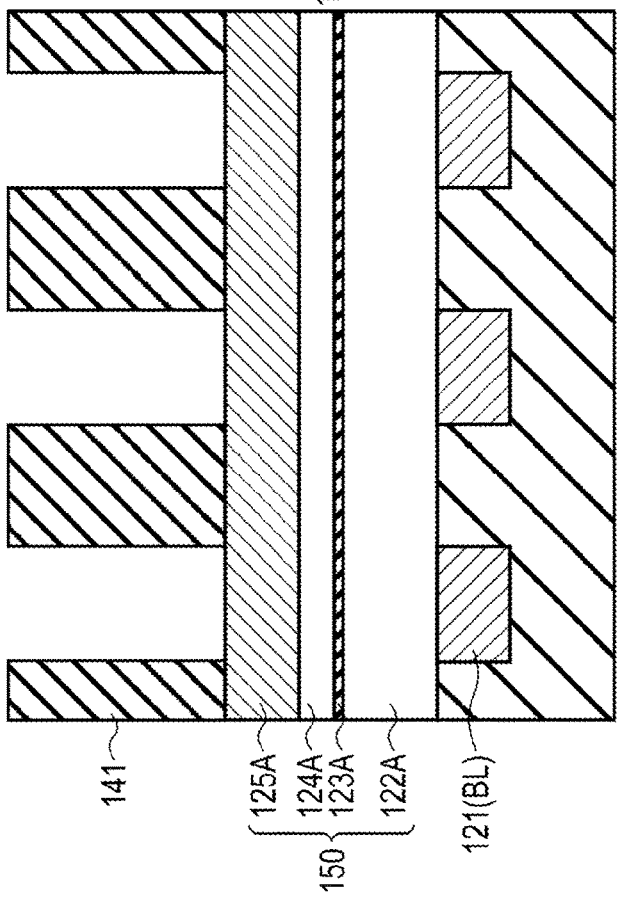

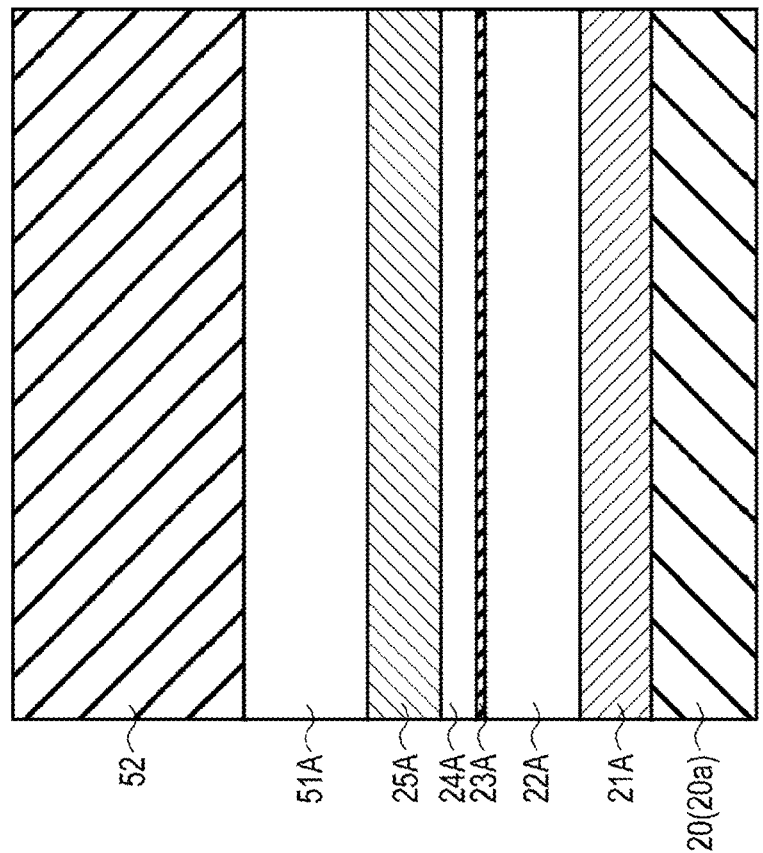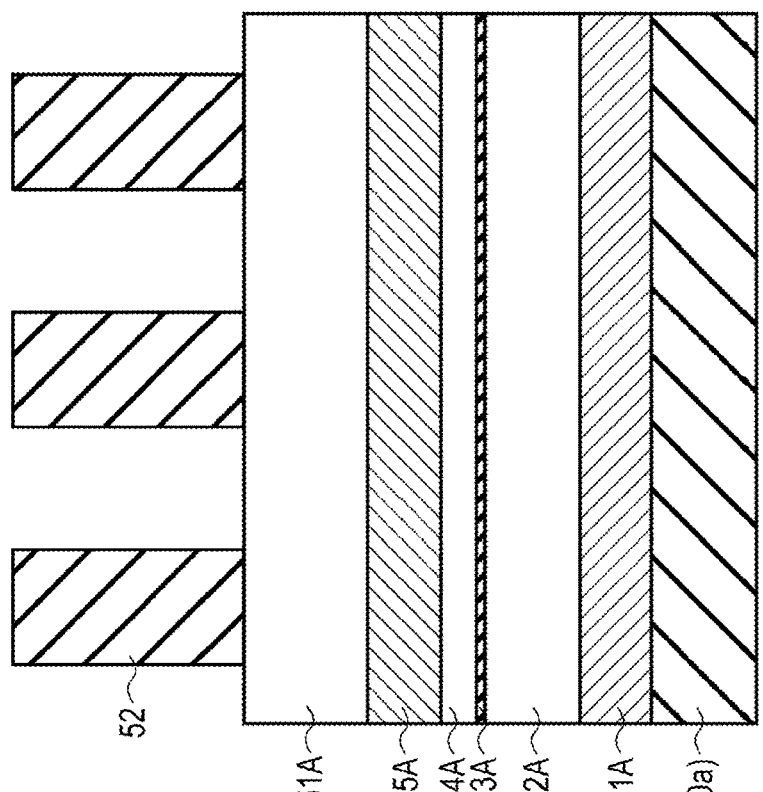

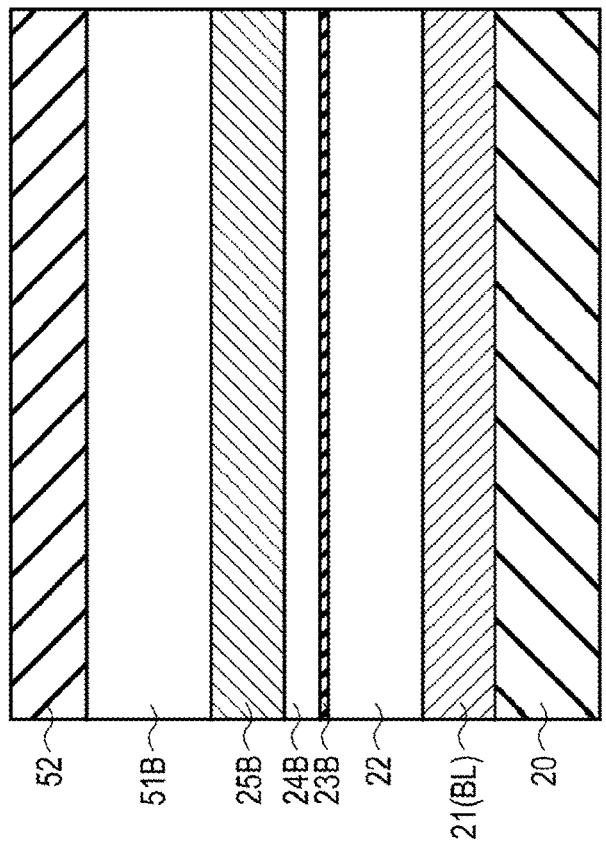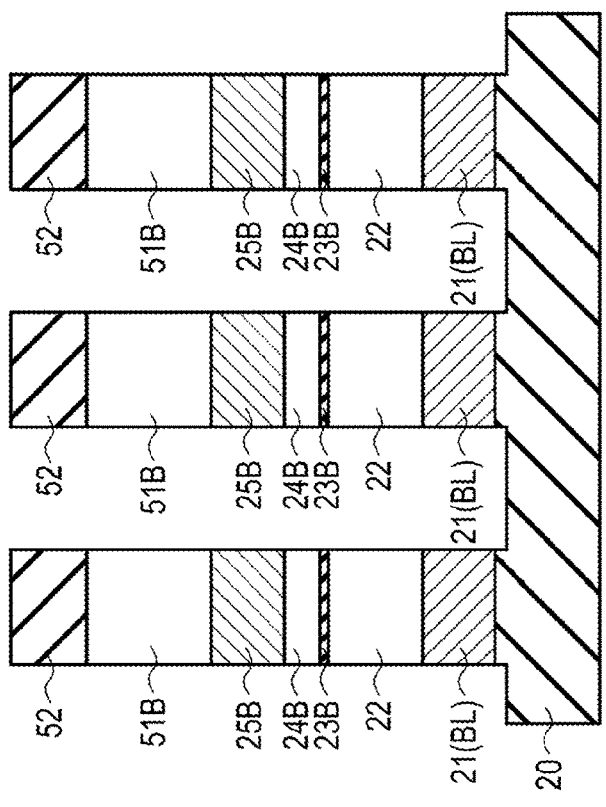

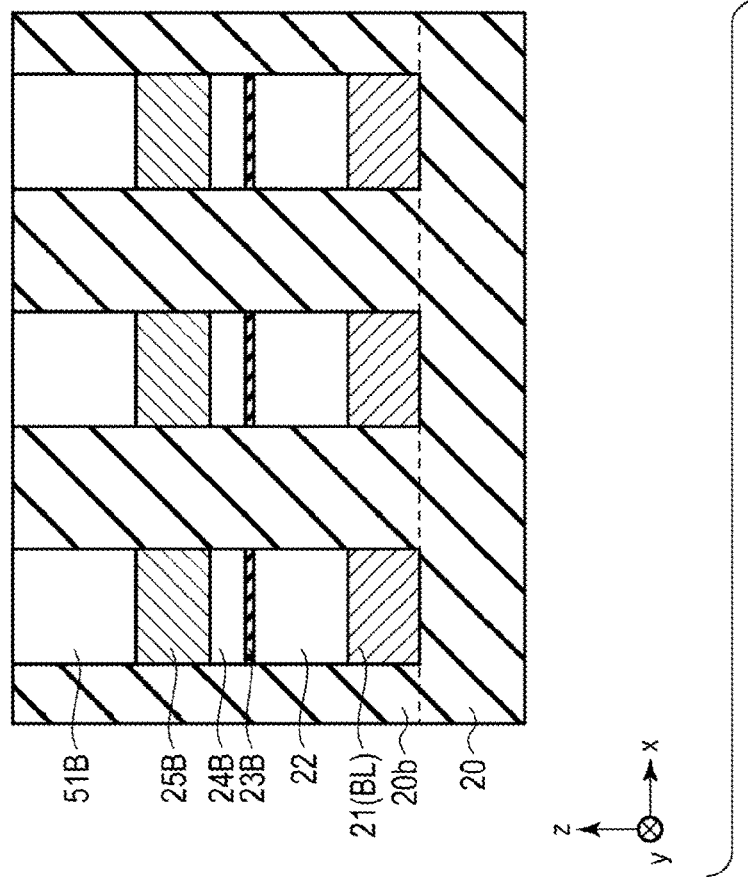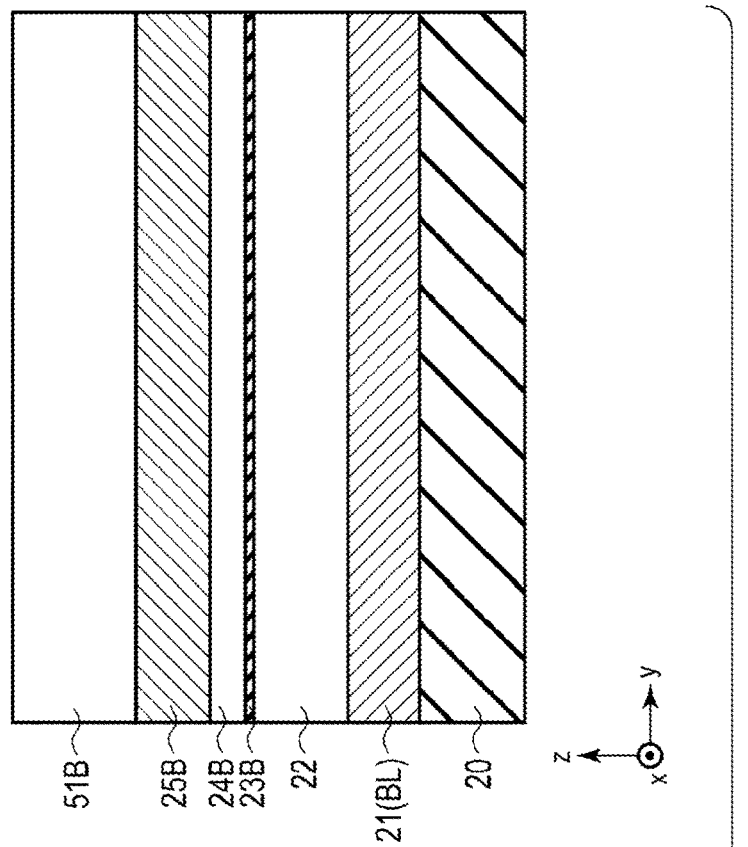

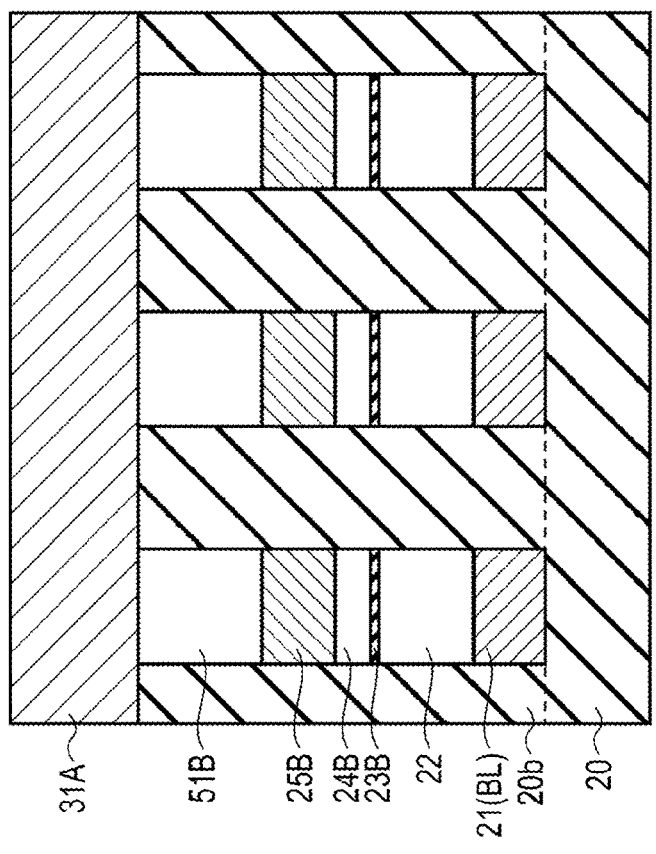
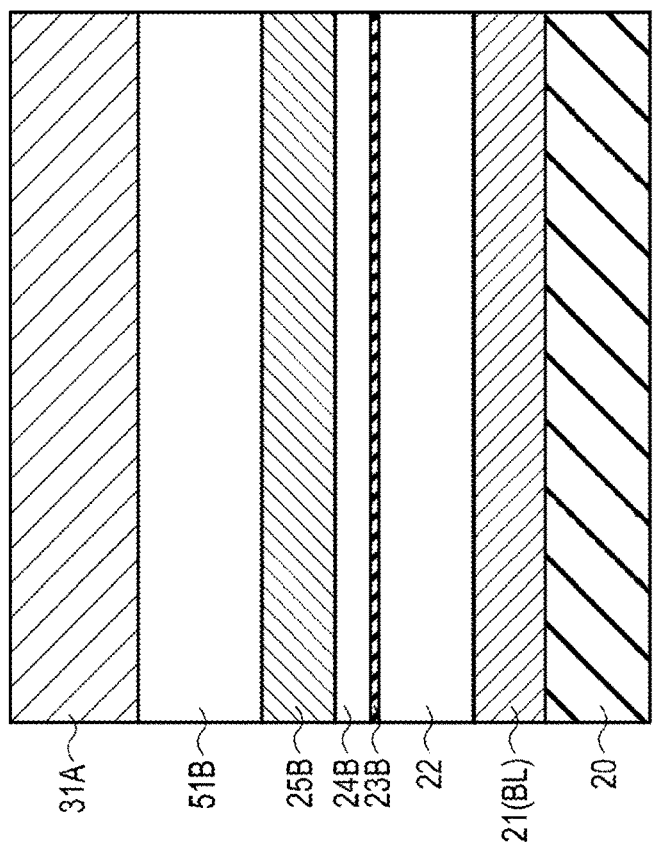

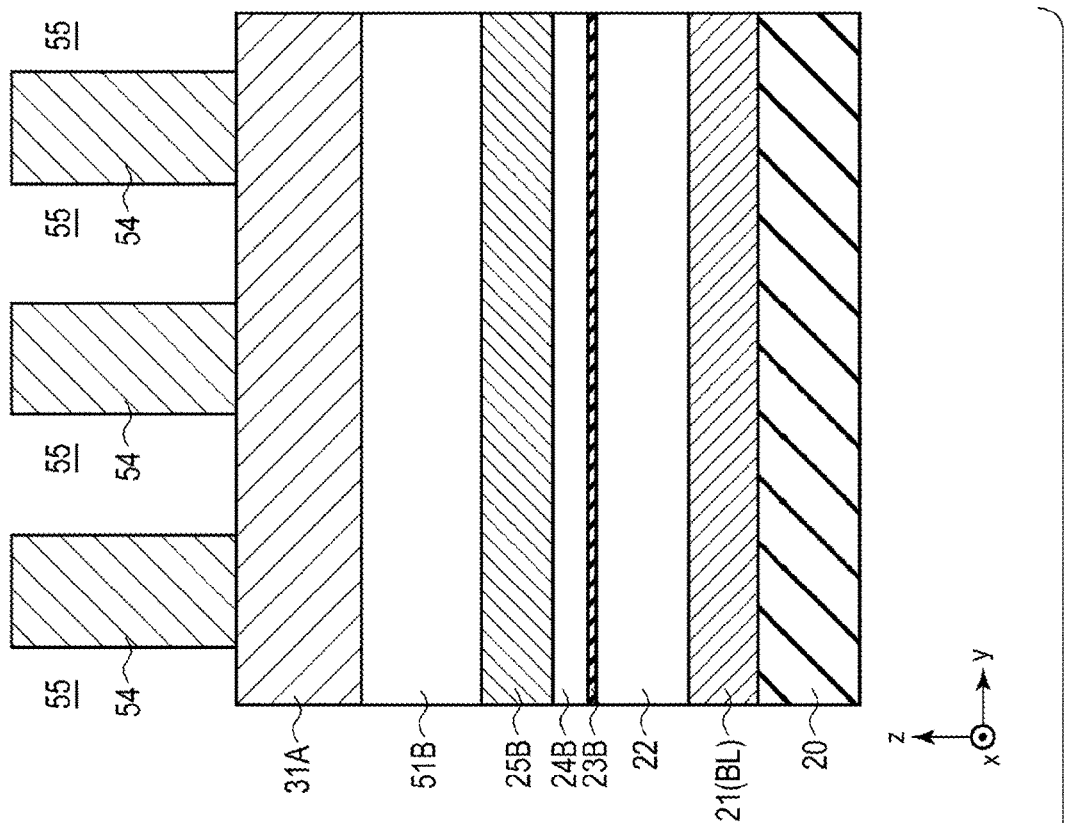
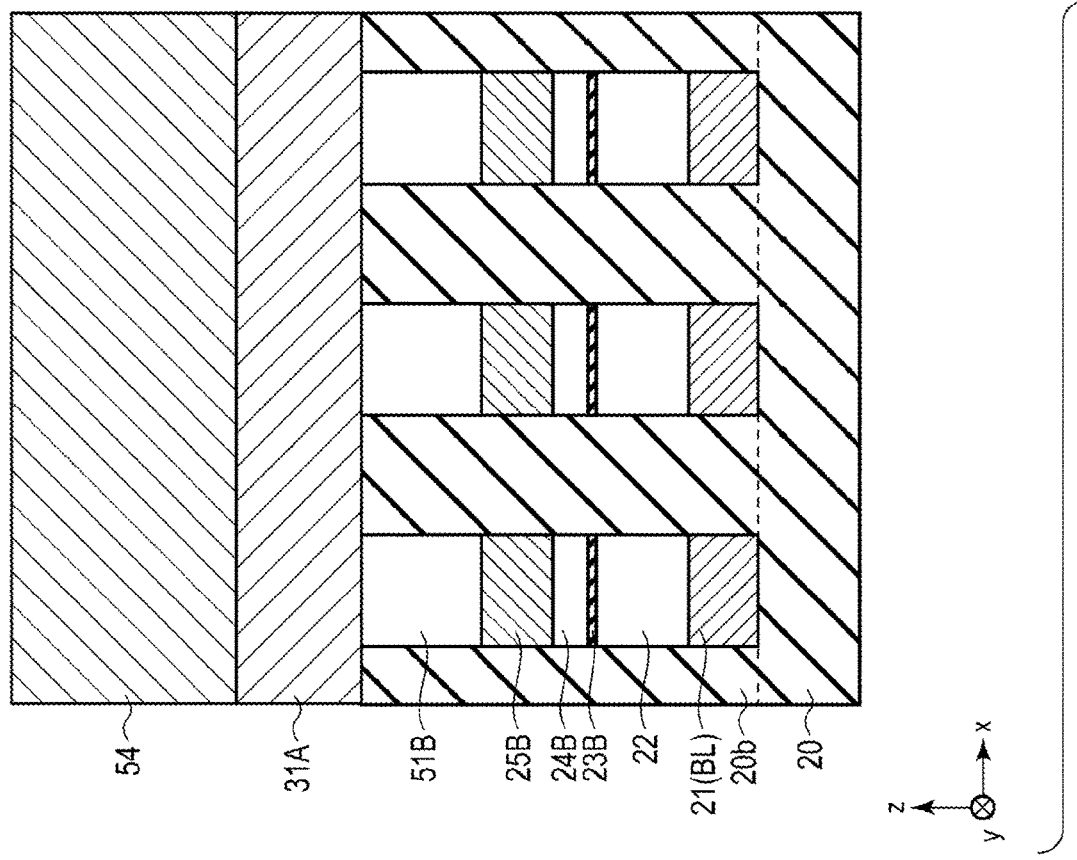

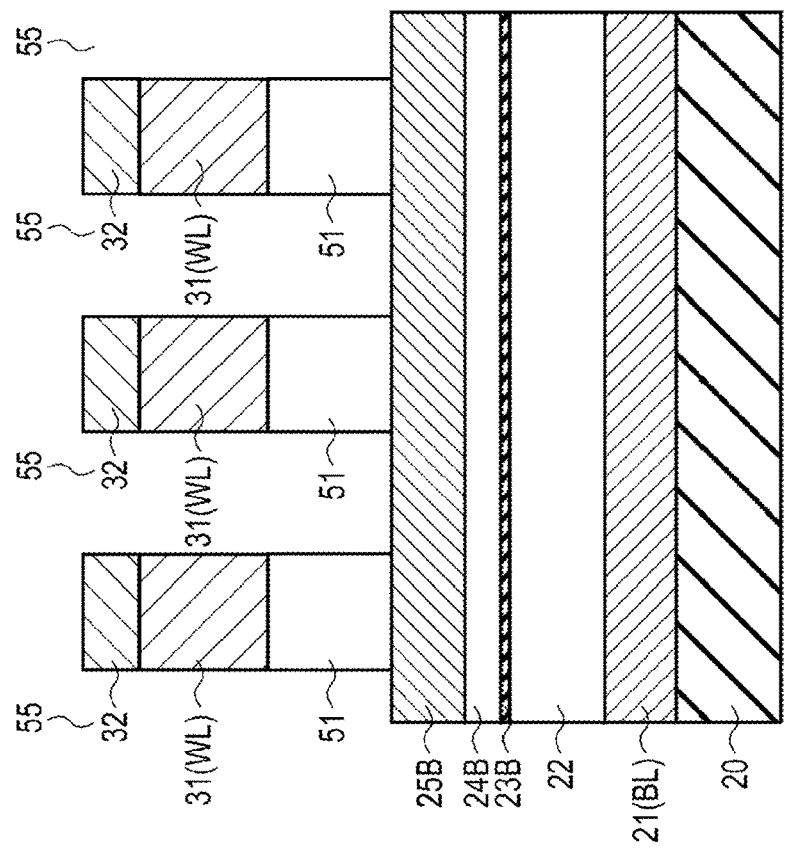
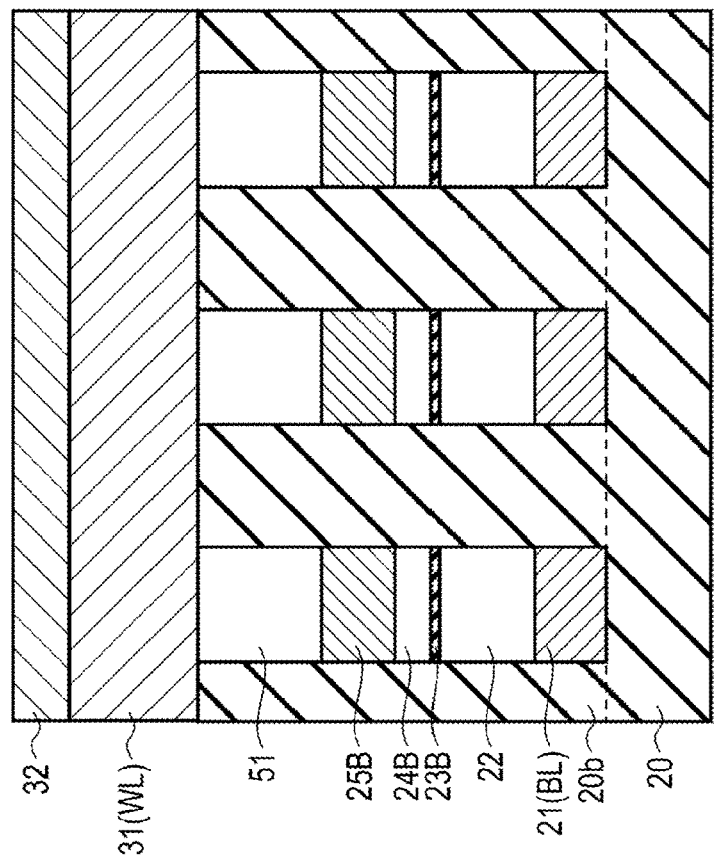

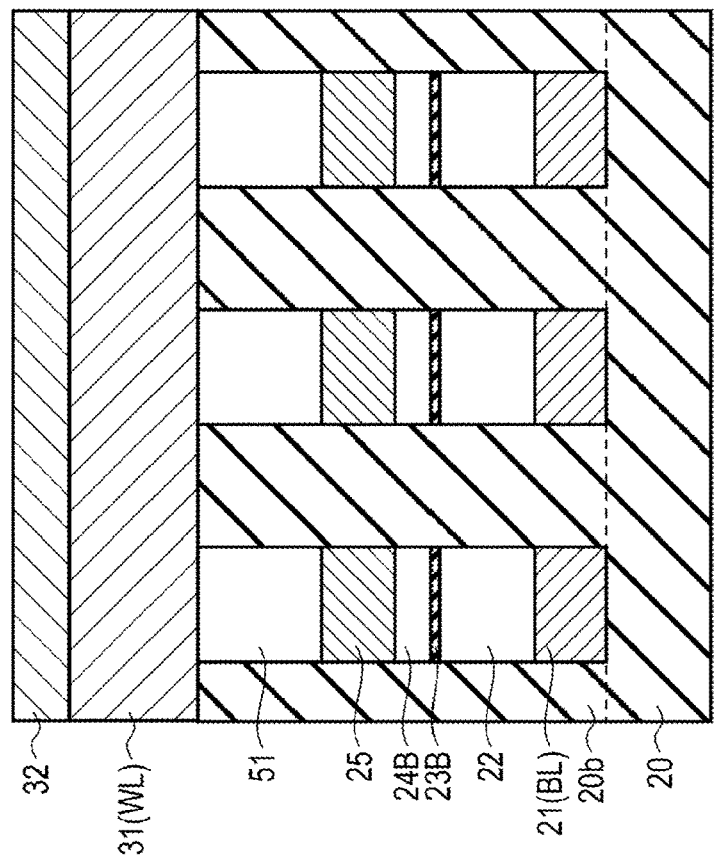

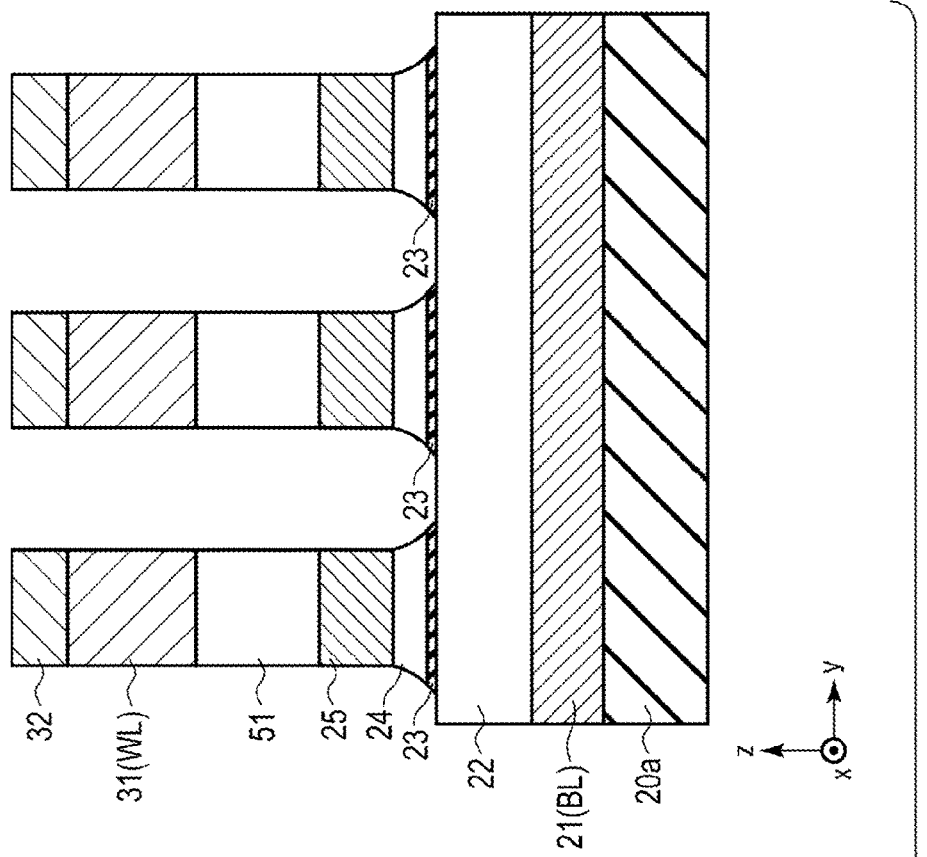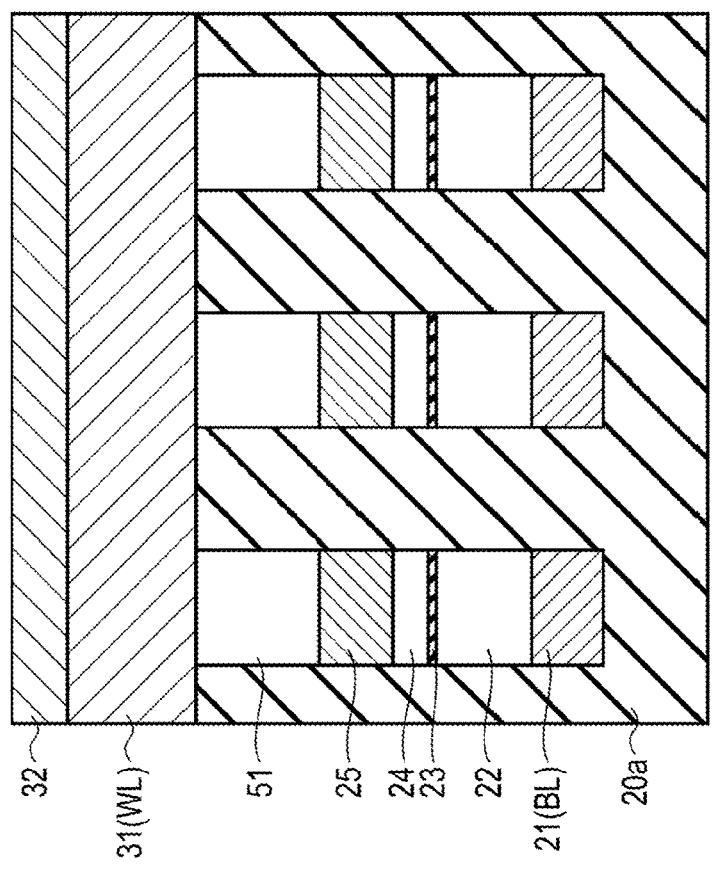

STORAGE DEVICE AND METHOD FOR MANUFACTURING STORAGE DEVICE

CROSS-REFERENCE TO RELATED APPLICATION

This application is based upon and claims the benefit of priority from Japanese Patent Application No. 2018-173091, filed Sep. 14, 2018, the entire contents of which are incorporated herein by reference.

FIELD

Embodiments generally relate to a storage device and a method for manufacturing a storage device.

BACKGROUND

A storage device that stores data using a variable resistance of an element is known.

DESCRIPTION OF THE DRAWINGS

FIGS. 4A and 4B show cross-sectional structures of a part of the memory cell array according to the first embodiment.

FIGS. 7A, 7B, 8A, 8B, 9A, 9B, 10A, 10B, 11A, 11B, 12A, 12B, 13A, 13B, 14A, 14B, 15A, and 15B illustrate steps of manufacturing the storage device according to the first embodiment.

FIGS. 16A and 16B illustrate a step of manufacturing a storage device according to a comparative example.

FIGS. 19A, 19B, 20A, 20B, 21A, 21B, 22A, 22B, 23A, 23B, 24A, 24B, 25A, 25B, 26A, 26B, 27A and 27B illustrate steps of manufacturing the storage device according to the first embodiment.

DETAILED DESCRIPTION

Figure 1:
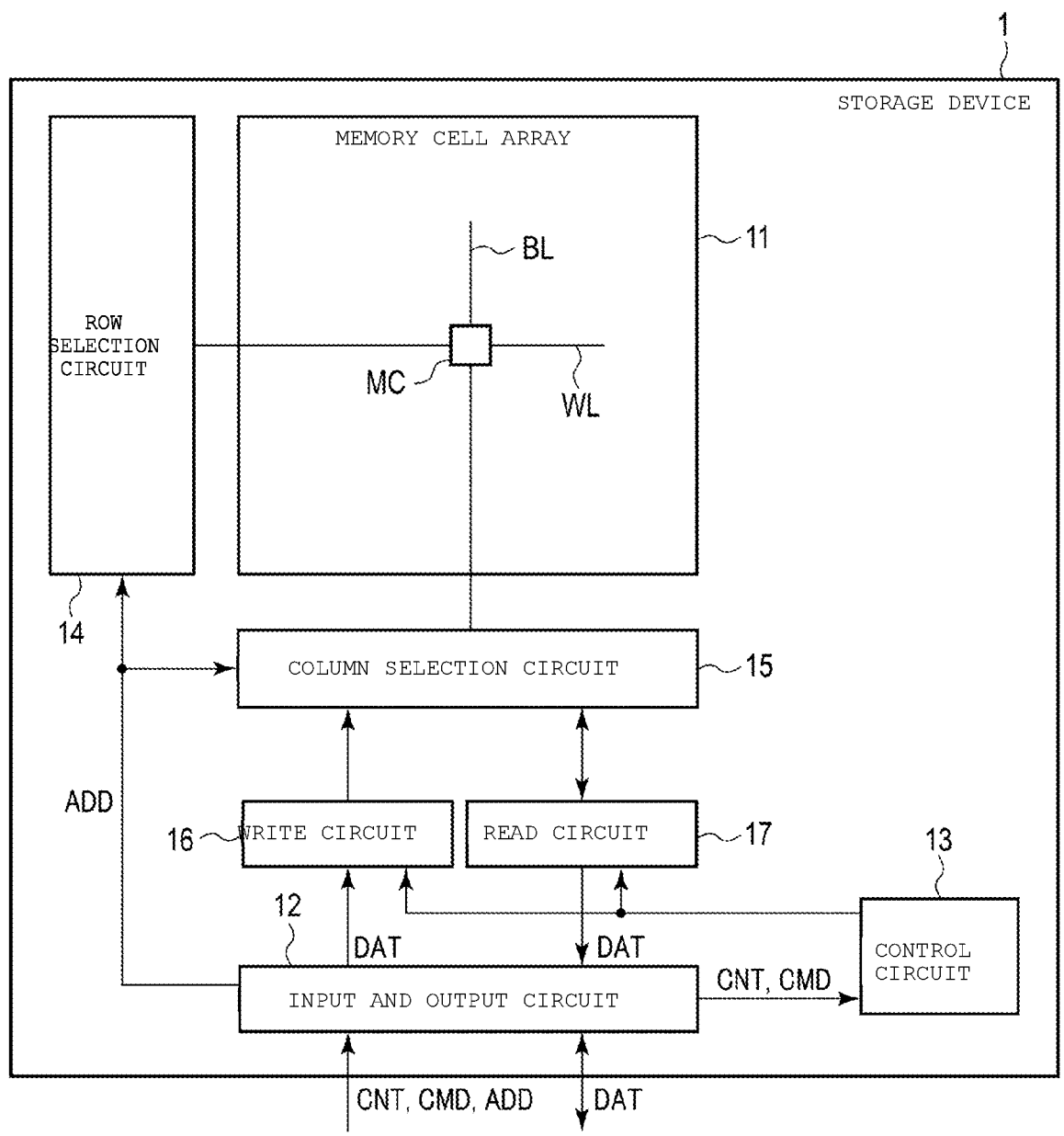
FIG. 1 shows a functional block of a storage device according to a first embodiment.

Embodiments provide a higher performance storage device.

In general, according to one embodiment, a storage device includes a first conductor that extends in a first direction, a first stacked body that extends in the first direction, is electrically connected to the first conductor, and includes a first ferromagnetic body that extends in the first direction, a second ferromagnetic body, a first insulator between the first stacked body and the second ferromagnetic body, a first switching element having a first end and a second end, wherein the first end is electrically connected to the second ferromagnetic body, the first switching element regulating current flow between the first end and the second end in response to a voltage applied between the first end and the second end, a second conductor that extends in a second direction crossing the first direction and is electrically connected to the second end of the first switching element, a third ferromagnetic body, and a second insulator between the third ferromagnetic body and another stacked body that extends in the first direction.

Hereinafter, embodiments will be described below with reference to the drawings. In the following description, the same reference numerals will be given to elements having substantially the same function and configuration, and there will be a case where repetitive description thereof is omitted. The drawing is schematic, and the relationship between the thickness and the planar dimension, the ratio or the like of the thickness of each layer may be different from the actual ratio. Further, in each drawing, some parts may have different relationships of dimensions or ratios from each other. Further, all the descriptions of certain embodiments are also employed as descriptions of other embodiments as long as they are not expressly or obviously excluded.

In the specification and claims, a case where a certain first element is "connected" to another second element includes a case where the first element is directly or normally or selectively connected to the second element via a conductive element.

First Embodiment

Configuration and Structure

FIG. 1 is block diagram of a storage device according to a first embodiment. As shown in FIG. 1, the storage device 1 includes a memory cell array 11, an input and output circuit 12, a control circuit 13, a row selection circuit 14, a column selection circuit 15, a write circuit 16, and a read circuit 17.

The memory cell array 11 includes a plurality of memory cells MC, a plurality of word lines WL, and a plurality of bit lines BL. The memory cell MC can store data in a nonvolatile manner. Each memory cell MC is connected to one word line WL and one bit line BL. The word line WL is associated with a row. The bit line BL is associated with a column. By selecting one row and selecting one or more columns, one or a plurality of memory cells MC are specified.

The input and output circuit 12 receives various control signals CNT, various commands CMD, address signals ADD, and data (write data) DAT, for example, from a memory controller, and sends data (read data) DAT, for example, to the memory controller.

The row selection circuit 14 receives the address signal ADD from the input and output circuit 12 and brings one word line WL that corresponds to a row specified by the received address signal ADD into a selected state.

The column selection circuit 15 receives the address signal ADD from the input and output circuit 12 and brings the plurality of bit lines BL that correspond to the columns specified by the received address signal ADD into a selected state.

The control circuit 13 receives the control signal CNT and the command CMD from the input and output circuit 12. The control circuit 13 controls the write circuit 16 and the read circuit 17, based on the control instructed by the control signal CNT and the command CMD. Specifically, the control circuit 13 supplies a voltage used for the data writing to the write circuit 16 during the write of data to the memory cell array 11. Further, the control circuit 13 supplies a voltage used for the data reading to the read circuit 17 during the reading of data from the memory cell array 11.

The write circuit 16 receives the write data DAT from the input and output circuit 12 and supplies the voltage used for the data writing to the column selection circuit 15 based on the control of the control circuit 13 and the write data DAT.

The read circuit 17 includes a sense amplifier, and calculates the data held in the memory cell MC by using the voltage used for the data reading, based on the control of the control circuit 13. The calculated data is supplied to the input and output circuit 12 as the read data DAT.

Figure 2:
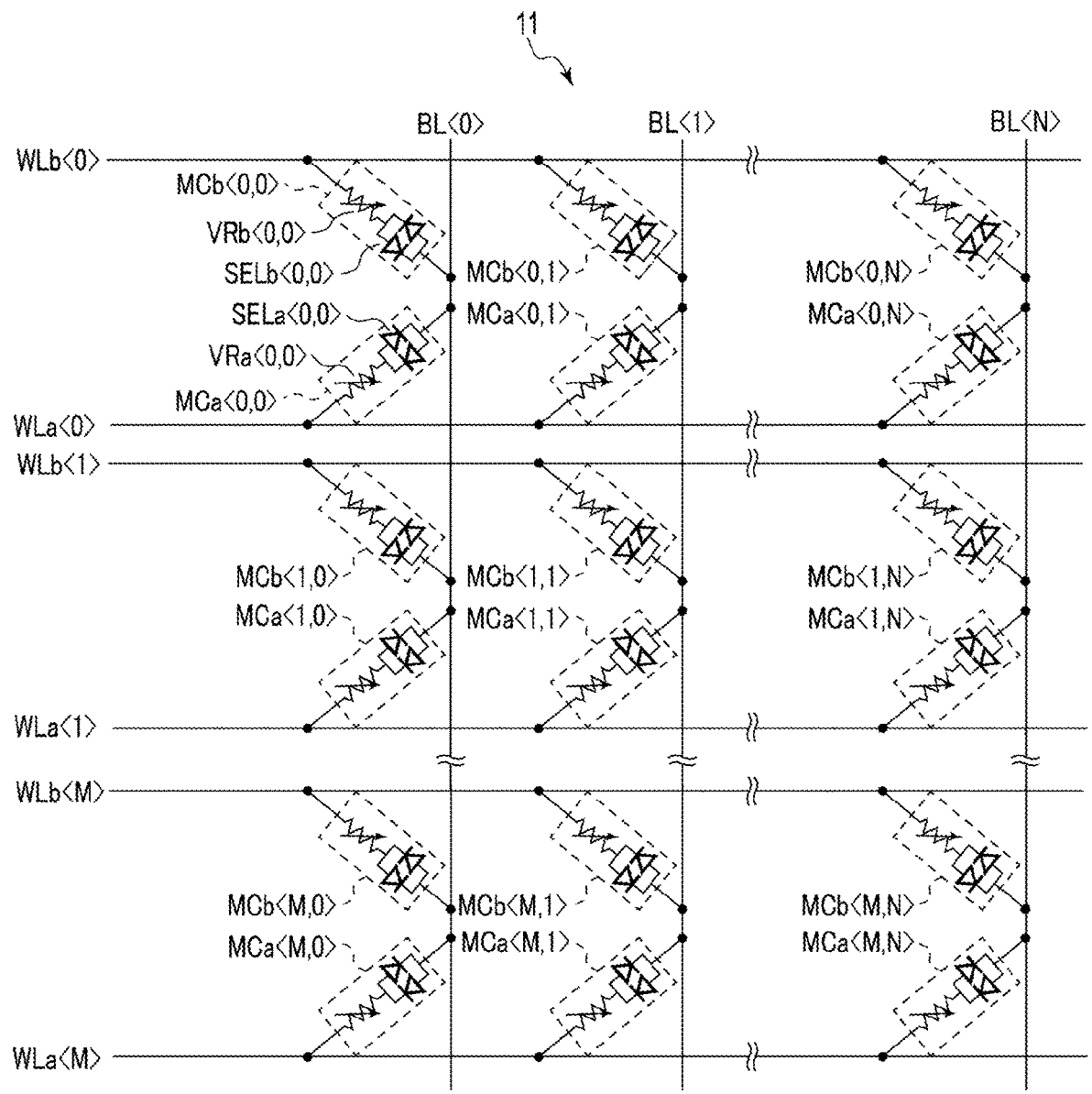
FIG. 2 is a circuit diagram of a memory cell array according to the first embodiment.

FIG. 2 is a circuit diagram of the memory cell array 11 according to the first embodiment. As shown in FIG. 2, the memory cell array 11 includes M+1 (M is a natural number) word lines WLa (WLa<0>, WLa<1>, ..., and WLa<M>) and M+1 word lines WLb (WLb<0>, WLb<1>, and WLb<M>). The memory cell array 11 also includes N+1 (N is a natural number) number of bit lines BL (BL<0>, BL<1>, ..., and BL<N>).

Each of the memory cells MC (MCa and MCb) has two nodes, is connected to one word line WL at a first node, and is connected to one bit line BL at a second node. More specifically, the memory cell MCa includes memory cells MCa <α, β> for all combinations of all cases where α is equal to or greater than 0 and equal to or less than M and all cases where β is equal to or greater than 0 and equal to or less than N, and the memory cell MCa <α, β> connects the word line WLa <α> and the bit line BL<β> to each other. Similarly, the memory cells MCb include memory cells MCb <α, β> for all combinations of all cases where α is equal to or greater than 0 and equal to or less than M and all cases where β is equal to or greater than 0 and equal to or less than N, and the memory cell MCb <α, β> connects the word line WLb <α> and the bit line BL<β> to each other.

Each memory cell MC includes one variable resistance element VR (VRa or VRb) and one switching element SEL (SELa or SELb). More specifically, the memory cell MCa <α, β> includes the variable resistance element VRa <α, β> and the switching element SELa <α, β> for all combinations of all cases where a is equal to or greater than 0 and equal to or less than M and all cases where β is equal to or greater than 0 and equal to or less than N. Furthermore, the memory cell MCb <α, β> includes the variable resistance element VRb <α, β> and the switching element SELb <α, β> for all combinations of all cases where α is equal to or greater than 0 and equal to or less than M and all cases where β is equal to or greater than 0 and equal to or less than N.

In each of the memory cells MC, the variable resistance element VR and the switching element SEL are connected to each other in series. The variable resistance element VR is connected to one word line WL, and the switching element SEL is connected to one bit line BL.

The variable resistance element VR can switch between a low resistance state and a high resistance state. The variable resistance element VR can hold one bit of data by using the difference between the two resistance states.

The switching element SEL has two terminals, and when a voltage less than a first threshold voltage is applied between the two terminals in a first direction, the switching element SEL is in a high resistance state, for example, in an electrically non-conductive state (off state). On the other hand, when a voltage equal to or greater than the first threshold voltage is applied between the two terminals in the first direction, the switching element SEL is in a low resistance state, for example, in an electrically conductive state (on state). The switching element SEL performs the switching function between the high resistance state and the low resistance state based on the magnitude of the voltage applied in the first direction, and also a similar function in a second direction opposite to the first direction. By switching on or off the switching element SEL, it is possible to control the presence of the supply of the current to the variable resistance element VR connected to the switching element SEL, that is, selection or non-selection of the variable resistance element VR.

Figure 3:
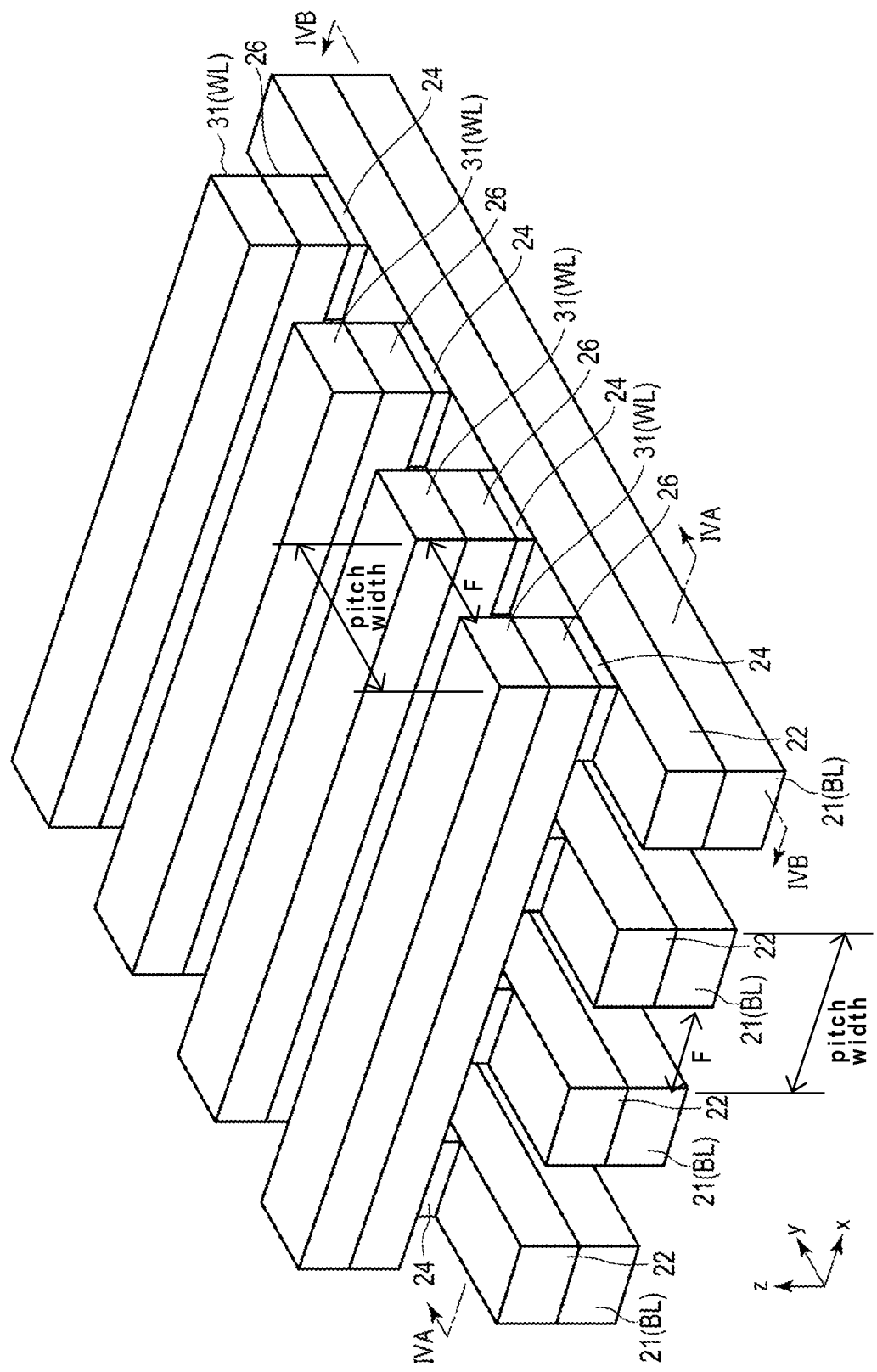
FIG. 3 is a perspective view of a schematic structure of a part of the memory cell array according to the first embodiment.

FIG. 3 is a perspective view of a schematic structure of a part of the memory cell array 11 according to the first embodiment. In FIG. 3, several elements are not shown or shown in a simplified manner. FIG. 4A shows a structure of a part of a section taken along line IVA-IVA in FIG. 3, and FIG. 4B shows a structure of a part of a section taken along line IVB-IVB in FIG. 3.

As shown in FIGS. 3 and 4, a first part 20a of an insulator 20 is provided above a surface along an xy plane of a board (not shown). A transistor (not shown) is provided on the board.

The first part 20a of the insulator 20 spreads out along the xy plane. A plurality of conductors 21 are provided on the first part 20a. The conductors 21 extend along the y axis and are arranged at intervals along the x axis. Each of the conductors 21 functions as one bit line BL.

Stacked bodies 22 are provided on the upper surfaces of each of the conductors 21. The stacked bodies 22 extend along the y axis and are arranged at intervals along the x axis. Each of the stacked bodies 22 extends along the y axis above the corresponding conductor 21 which is below the stacked bodies 22 and for example has the same planar shape as the shape (planar shape) of the corresponding conductor 21 in the xy plane. Here, the interval between stacked bodies 22 is a set width of F (feature size). The meaning of F is detailed below.

Each of the stacked bodies 22 includes at least one ferromagnetic body and exhibits magnetization due to the ferromagnetic body in the stacked body 22. The direction of magnetization of one ferromagnetic body in the stacked body 22 is unchanged by reading and writing the data in the storage device 1, and the stacked body 22 can function as a so-called reference layer.

A plurality of insulators 23 are provided on the upper surfaces of each of the stacked bodies 22. The width of the insulator 23 in the x axis direction is, for example, the same as the width of the corresponding stacked body 22 below the insulator 23 in the x axis direction. The length of the insulator 23 in the y axis direction is approximately equal to F, for example.

The insulator 23 includes or is made of a nonmagnetic insulator, such as MgO. The insulator 23 can function as a tunnel barrier.

One ferromagnetic body 24 is provided on the upper surface of each of the insulators 23. The width of the ferromagnetic body 24 in the x axis direction is, for example, the same as the width of the corresponding stacked body 22 below the ferromagnetic body 24. The length of the ferromagnetic body 24 in the y axis direction is approximately equal to F, for example. The ferromagnetic body 24 includes or is made of, for example, cobalt iron boron (CoFeB) or iron boride (FeB). The direction of magnetization of the ferromagnetic body 24 is changed by the data writing, and the ferromagnetic body 24 can function as a so-called storage layer.

A set including the stacked body 22, one insulator 23, and one ferromagnetic body 24 exhibits a tunnel magnetoresistive effect and can function as one variable resistance element VR. The tunnel magnetoresistive effect is a phenomenon in which the resistance values differ between a case where the directions of magnetization of two ferromagnetic bodies are parallel and a case where the directions are antiparallel, in a structure including two ferromagnetic bodies sandwiching the insulator. In a case where the directions are parallel, the resistance value is smaller than the resistance value in a case where the directions are antiparallel. The states exhibiting two different resistance values can be assigned to express binary data. The variable resistance element VR shown in FIGS. 4A and 4B includes a magnetic tunnel junction (MTJ).

As described above, each of the stacked bodies 22 is connected to a plurality of ferromagnetic bodies 24, and accordingly, can function as the reference layer for each of the plurality of variable resistance elements VR including each of the plurality of ferromagnetic bodies 24 connected to the stacked bodies 22. In other words, each of the stacked bodies 22 is jointly used by the plurality of variable resistance elements VR and by the plurality of memory cells MC. For the sake of convenience, a part 22a below a set including one insulator 23 and one ferromagnetic body 24 in each of the stacked bodies 22 can be considered to function together with the insulator 23 and the ferromagnetic body 24 as one variable resistance element VR.

Conductors 25 are provided on the upper surfaces of each of the ferromagnetic bodies 24. For example, the conductor 25 has the same planar shape as the planar shape of the corresponding ferromagnetic body 24 below the conductor 25. The conductor 25 includes or is made of at least one of the group consisting of platinum (Pt), tungsten (W), tantalum (Ta), and ruthenium (Ru).

Variable resistance materials 26 are provided on the upper surfaces of each of the plurality of conductors 25 arranged along the x axis. The variable resistance materials 26 extend along the x axis and are arranged at intervals along the y axis. The variable resistance material 26 has, for example, a width of F in the y axis direction. Further, the interval between the variable resistance materials 26 in the y axis direction is, for example, F.

The variable resistance materials 26 can function as a plurality of switching elements SEL connected respectively to the plurality of variable resistance elements VR. Each of the variable resistance materials 26 is jointly used by the plurality of memory cells MC.

The switching element SEL is, for example, a switching element between two terminals. The first terminal of the two terminals corresponds to either the upper surface or the bottom surface, and the second terminal of the two terminals corresponds to the other surface. For example, the variable resistance material 26 may contain at least one chalcogen element selected from the group consisting of Te, Se, and S. Alternatively, the variable resistance material 26 may contain a chalcogenide, a compound containing a chalcogen element. For example, the variable resistance material 26 may further contain at least one element selected from the group consisting of B, Al, Ga, In, C, Si, Ge, Sn, As, P, and Sb.

One conductor 31 is provided on the upper surface of each of the variable resistance materials 26. The conductors 31 extend along the x axis and are arranged at intervals along the y axis. Each of the conductors 31 has, for example, the same planar shape as the planar shape of the corresponding variable resistance material 26 on the lower side. The conductor 31 has, for example, a width of F in the y axis direction. Further, the interval between the conductors 31 in the y axis direction is, for example, F. Each of the conductors 31 functions as one word line WL. The width of F, as described above, corresponds to one-half of one pitch width. One pitch width is the distance between adjacent conductors 31 in the y axis direction or the distance between adjacent conductors 21 in the x axis direction. The "pitch width" and the width "F" are illustrated in FIG. 3.

One hard mask 32 is provided on the upper surface of each of the conductors 31. The hard mask 32 is, for example, silicon nitride (SiN). The hard masks 32 extend along the x axis and are arranged at intervals along the y axis. Each of the hard masks 32 has, for example, the same planar shape as the planar shape of the corresponding conductor 31 on the lower side. Further, since the hard mask 32 is used in a manufacturing process to be described later, the hard mask 32 need not be provided in the final structure.

Among the layers from the upper surface of the insulator 20a to the layer of the conductor 25, at a part at which the conductor 21, the stacked body 22, the insulator 23, the ferromagnetic body 24, the conductor 25, the variable resistance material 26, the conductor 31, and the hard mask 32 are not provided, another part 20b of the insulator 20 is provided.

Additional conductors may be provided between the two connected ferromagnetic bodies or conductors in FIG. 4.

Figure 5:
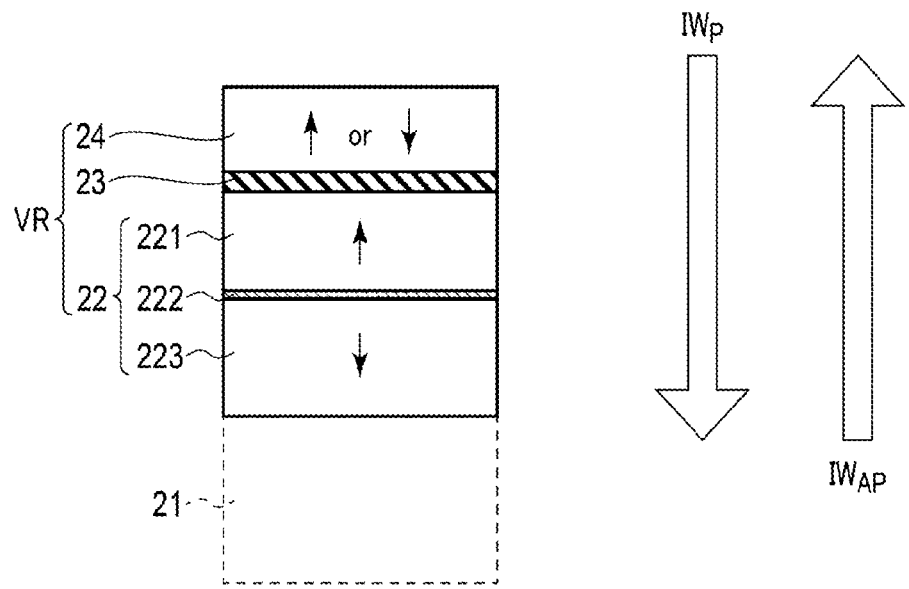
FIG. 5 shows a structure of a MTJ element according to the first embodiment.

FIG. 5 shows a structure of the variable resistance element VR according to the first embodiment. The stacked body 22 includes a ferromagnetic body 221 as at least one ferromagnetic body. The direction of magnetization of the ferromagnetic body 221 is also unchanged by reading and writing the data in the storage device 1. The ferromagnetic bodies 24 and 221 have easy magnetization axes (indicated by arrows) along the direction passing through interfaces of the ferromagnetic body 24, the insulator 23, and the ferromagnetic body 221. The ferromagnetic bodies 24 and 221 may also have easy magnetization axes along the interfaces of the ferromagnetic body 24, the insulator 23, and the ferromagnetic body 221.

When the direction of magnetization of the ferromagnetic body 24 is parallel to the direction of magnetization of the ferromagnetic body 221, the variable resistance element VR is in a P state and is in a low resistance state. When the direction of magnetization of the ferromagnetic body 24 is antiparallel to the direction of magnetization of the ferromagnetic body 221, the variable resistance element VR is in an AP state and is in a high resistance state.

In order to read the data, an appropriate voltage is applied to the word line WL and the bit line BL connected to the variable resistance element VR of the memory cell MC that is a data read target. Due to the voltage, a read current Ir flows through the variable resistance element VR. The read current Ir has different magnitudes based on whether the variable resistance element VR is in the AP or P state. Based on the magnitude of the read current Ir that flows through the variable resistance element VR, the resistance state of the variable resistance element VR is determined by the read circuit 17.

When a write current $IW_P$ flows from the ferromagnetic body 24 toward the ferromagnetic body 221, the direction of magnetization of the ferromagnetic body 24 becomes parallel to the direction of magnetization of the ferromagnetic body 221. On the other hand, when the write current $I_{W_{AP}}$ flows from the ferromagnetic body 221 toward the ferromagnetic body 24, the direction of magnetization of the ferromagnetic body 24 becomes antiparallel to the direction of magnetization of the ferromagnetic body 221. The above-described fact that the direction of magnetization of the ferromagnetic body 221 is "unchanged" indicates a case where the direction of magnetization of the ferromagnetic body 221 does not change due to the current having a magnitude that can reverse the direction of magnetization of the ferromagnetic body 24.

The ferromagnetic body 221 includes or is made of, for example, cobalt platinum (CoPt), cobalt nickel (CoNi), or cobalt palladium (CoPd). The ferromagnetic body 221 has the same planar shape as the planar shape of the stacked body 22.

The stacked body 22 may have a synthetic antiferromagnetic (SAF) structure. Therefore, the stacked body 22 may further include a conductor 222 and a ferromagnetic body 223. Each of the ferromagnetic bodies 223 is placed on the upper surface of one conductor 21. The ferromagnetic body 223 reduces the so-called leakage magnetic field that is generated by the ferromagnetic body 221 and applied to the ferromagnetic body 24. The ferromagnetic body 223 has a magnetization in a direction opposite to the magnetization of the ferromagnetic body 221. The ferromagnetic body 223 includes or is made of CoPt, CoNi, or CoPd. The ferromagnetic body 223 has the same planar shape as the planar shape of the stacked body 22.

The conductor 222 antiferromagnetically couples the ferromagnetic body 223 and the ferromagnetic body 221 to each other. The conductor 222 includes or is made of, for example, Ru or Ir. It is known that two magnetic bodies sandwiching a Ru or Ir layer are ferromagnetically or antiferromagnetically coupled based on the thickness of the Ru or Ir layer. The conductor 222 has a thickness at which the ferromagnetic body 223 and the ferromagnetic body 221 are antiferromagnetically coupled to each other. The conductor 222 has the same planar shape as the planar shape of the stacked body 22. The conductor 222 may further include a layer of Pt and/or Pd.

Operation

Figure 6:
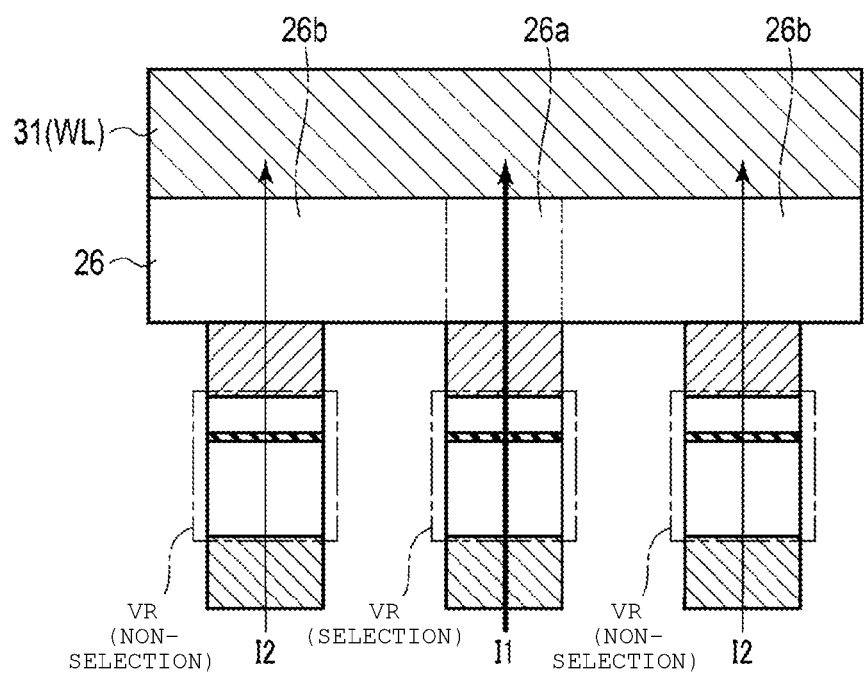
FIG. 6 shows a state of the storage device according to the first embodiment during an operation of a part of the storage device.

One variable resistance element VR is selected for writing the data or reading the data. Therefore, only the switching element SEL connected to the selected variable resistance element VR needs to be turned on. Accordingly, a certain voltage V is applied to the word line WL connected to the selected switching element SEL and to the bit line BL connected to the selected variable resistance element VR. The voltage V has such a magnitude that the selected switching element SEL is turned on and a current I1 (that is, the write current $IW_{AP}$ or $IW_P$ or the read current Ir) having a magnitude that corresponds to the processing for the selected switching element SEL flows. Since the variable resistance material 26 is connected to the plurality of variable resistance elements VR, by application of the voltage V, the current can flow across the wide range of the variable resistance material 26, as shown in FIG. 6. However, no voltage V is applied between the word line WL (which is conductor 31) and the non-selected bit line BL (which is conductor 21). Therefore, the current created by the voltage V flows mainly through a part 26a, and the current I1 flows through the part 26a. On the other hand, at a part 26b other than the part 26a of the variable resistance material 26, only a current I2 (<I1) flows. Accordingly, only the part 26a of the variable resistance material 26 is turned on. In this manner, even when the variable resistance material 26 is connected to the plurality of variable resistance elements VR, the current necessary for the data writing or reading can flow only through the selected variable resistance element VR.

Manufacturing Method

FIGS. 7A to 15B show states during the manufacturing process of the storage device 1 according to the first embodiment in order. Each of FIGS. 7A, 8A, 9A, 10A, 11A, 12A, 13A, 14A, and 15A shows structures of a cross section taken along line IVA-IVA in FIG. 3, and each of FIGS. 7B, 8B, 9B, 10B, 11B, 12B, 13B, 14B, and 15B shows structures of a cross section taken along line IVB-IVB in FIG. 3.

As shown in FIGS. 7A and 7B, a conductor 21A, a stacked body 22A, an insulator 23A, a ferromagnetic body 24A, and a conductor 25A are deposited in this order on the upper surface of the part 20a of the insulator 20. The conductor 21A, the stacked body 22A, the insulator 23A, the ferromagnetic body 24A, and the conductor 25A each include substantially the same material as that of the conductor 21, the stacked body 22, the insulator 23, the ferromagnetic body 24, and the conductor 25, respectively. Next, a hard mask 41 is formed on the upper surface of the conductor 25A. The hard mask 41 has a pattern that remains above a region where the conductor 21 and the stacked body 22 are to be formed and are open at other parts. In other words, the pattern of the hard mask 41 has a linear shape that extends along the y axis and has an interval along the x axis.

As shown in FIGS. 8A and 8B, the conductor 21A, the stacked body 22A, the insulator 23A, the ferromagnetic body 24A, and the conductor 25A are partly removed by etching using the hard mask 41 as a mask. The etching can be reactive ion etching (RIE) or ion beam etching (IBE). By the etching, the conductor 21, the stacked body 22, an insulator 23B, a ferromagnetic body 24B, and a conductor 25B are formed. The insulator 23B, the ferromagnetic body 24B, and the conductor 25B extend along the y axis similar to the conductor 21 and the stacked body 22 and are arranged at intervals along the x axis. By using the IBE, deterioration of the magnetic characteristics of the ferromagnetic bodies 221 and 223 in the stacked body 22 and the ferromagnetic body 24B can be prevented.

The IBE of FIGS. 8 and 8B may be performed using only the ion beam that goes forward along a yz plane to suppress the shadowing effect. Further, the IBE of FIGS. 8A and 8B can be performed using the ion beam that goes forward at an angle that is close to perpendicular to the xy plane. Further, the IBE of FIGS. 8A and 8B need only include one etching step under the same condition, or may include a plurality of etching steps under different conditions.

In some cases, a material removed from the conductor, for example, in the conductor 21A and/or the stacked body 22A by the IBE in FIGS. 8A and 8B, is redeposited on the side surface of the insulator 23B. The redeposited conductor can function as a current path bypassing the insulator 23B. The IBE steps with different conditions may be used to remove the redeposited conductors. Further, by oxidizing the redeposited conductor, the function of the bypass path can also be inhibited.

As shown in FIGS. 9A and 9B, the part 20b of the insulator 20 is deposited on the structure shown in FIGS. 8A and 8B. The part 20b of the insulator 20 fills in the region between the structures including the conductor 21, the stacked body 22, the insulator 23B, the ferromagnetic body 24B, the conductor 25B, and the hard mask 41.

As shown in FIGS. 10A and 10B, the upper portion of the part 20b of the insulator 20 and the hard mask 41 are removed by chemical mechanical polishing (CMP), for example. For example, the CMP is stopped at the height of the upper surface of the conductor 25B with the upper surface of the conductor 25B as a stopper.

As shown in FIGS. 11A and 11B, a variable resistance material 26A and a conductor 31A are deposited in this order on all the surfaces on the upper surface of the conductor 25B and the upper surface of the insulator 20b. The variable resistance material 26A and the conductor 31A each include substantially the same material as that of the variable resistance material 26 and the conductor 31, respectively.

Figure 12B:
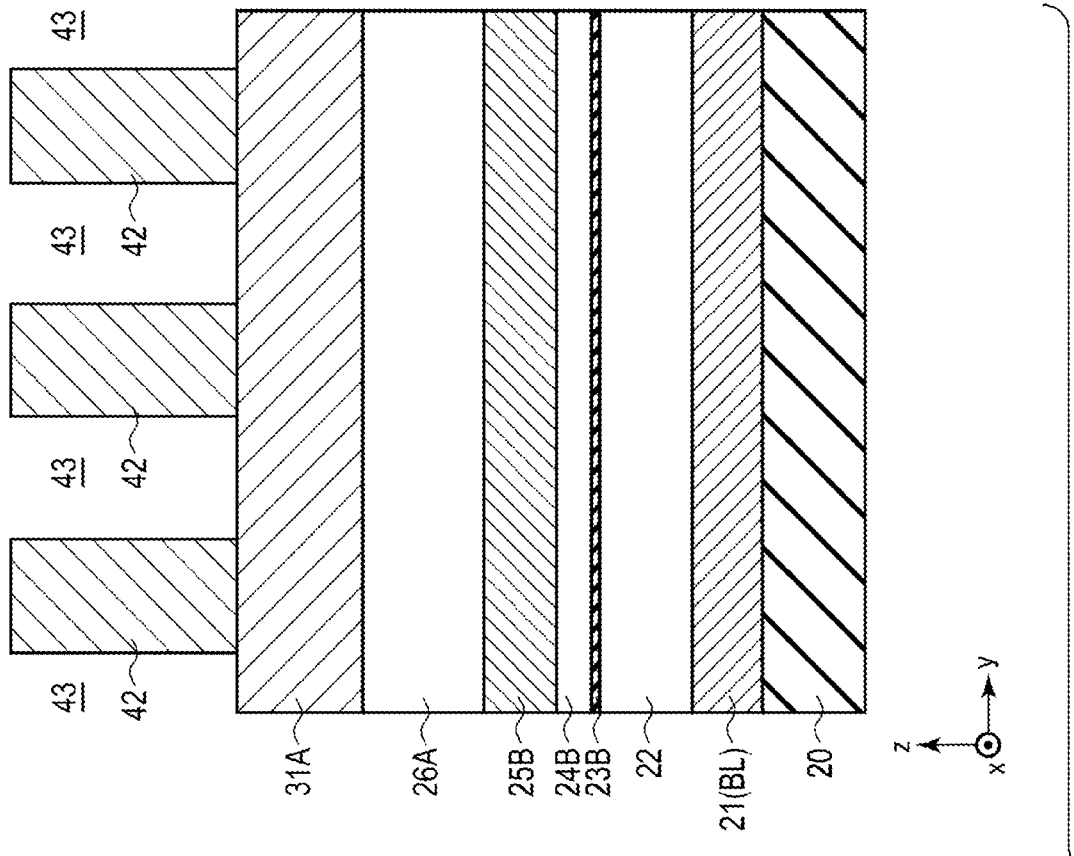
Figure 12A:
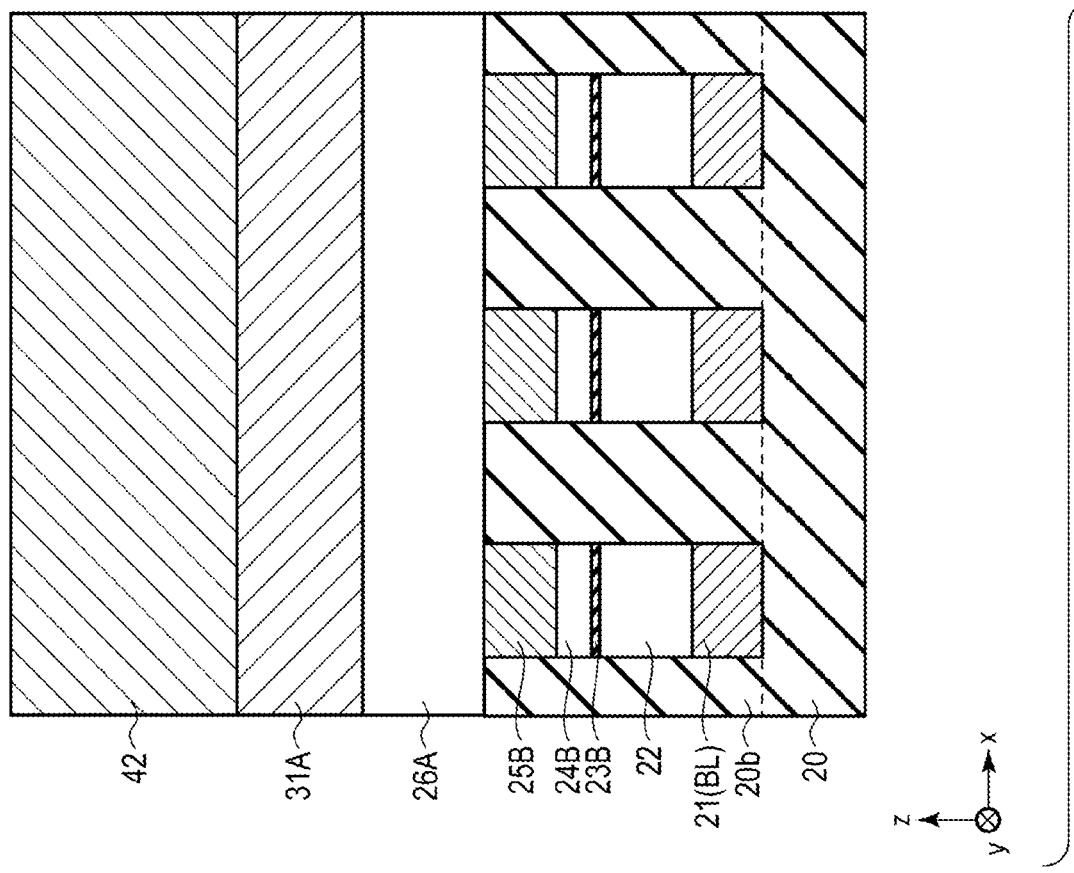

As illustrated in FIGS. 12A and 12B, a hard mask 42 is formed on the upper surface of the conductor 31A. The hard mask 42 has a pattern that remains above a region where the stacked structure of the variable resistance material 26 and the conductor 31 is to be formed and has an opening 43 at other parts. In other words, the pattern of the hard mask 42 has a linear shape that extends along the x axis and has intervals along the y axis. The hard mask 42 includes substantially the same material as the hard mask 32.

As shown in FIGS. 13A and 13B, the conductor 31A and the variable resistance material 26A are partly removed by etching using the hard mask 42 as a mask. The etching may be the RIE or the IBE. The etching is stopped at the height of the upper surface of the conductor 25B and the upper surface of the part 20b of the insulator 20. For example, the RIE may be used to stop the etching at the height of the upper surface of the conductor 25B and the height of the upper surface of the part 20b of the insulator 20. By the etching, the lower part of the opening 43 on the upper surface of the conductor 25B is exposed, and the variable resistance material 26 and the conductor 31 are formed. Further, the upper surface of the hard mask 42 is lowered by the etching, and the remaining part at the time of the completion of the etching in the hard mask 42 remains as the hard mask 32. In a case where the IBE is used, for example, the IBE can be performed using only the ion beam that goes forward along an xz plane.

Figure 14A:
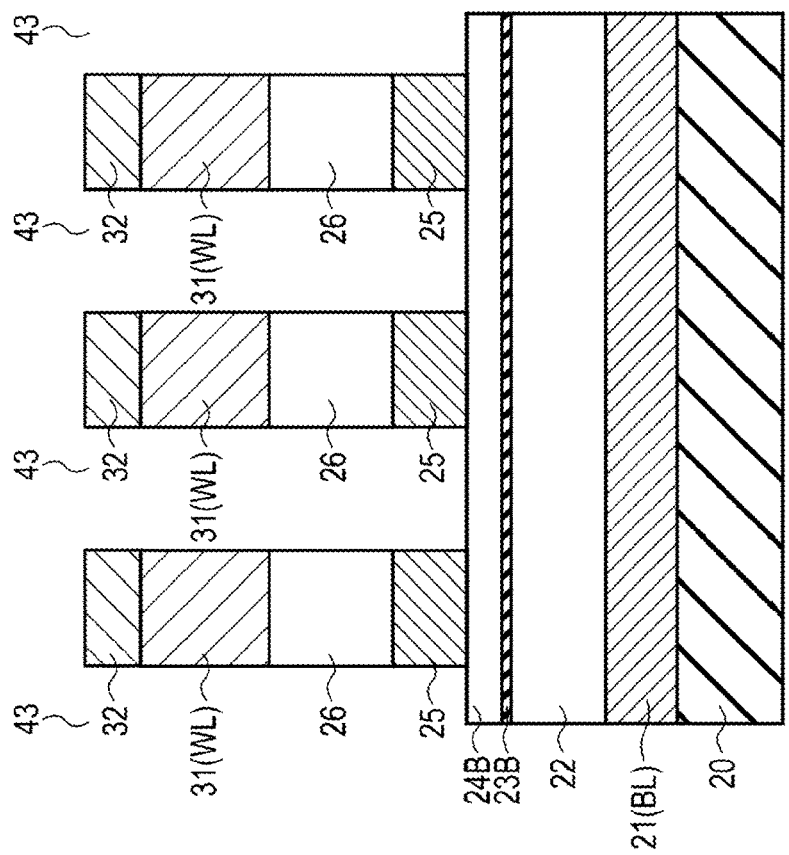
Figure 14B:
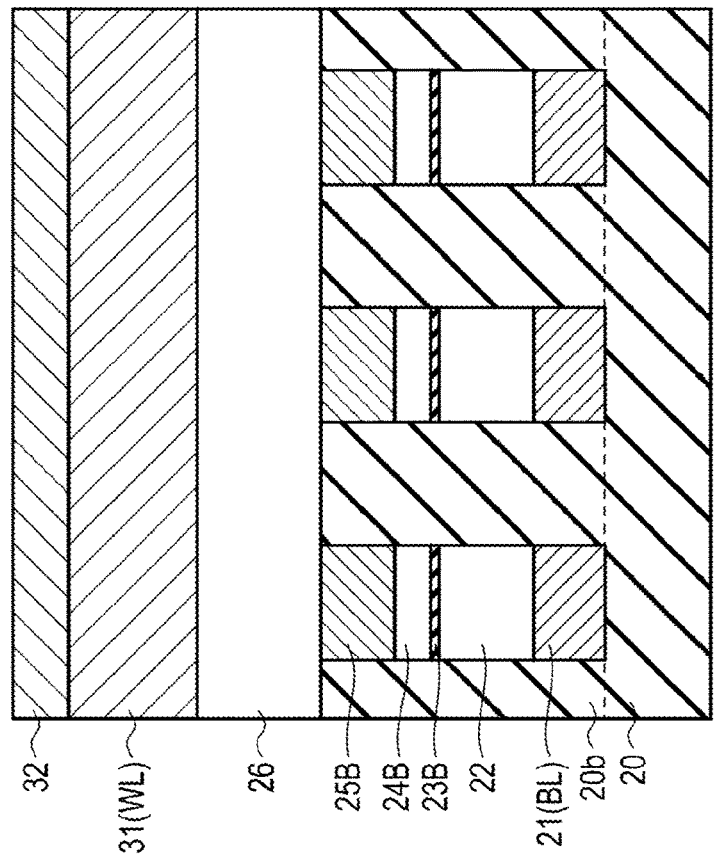

As shown in FIGS. 14A and 14B, the lower part of the opening 43 in the conductor 25B is removed. The removal can be performed, for example, by the RIE, that is, by volatilizing the exposed part through $O_2$ process. As a result of partly removing the conductor 25B, the conductor 25 is formed, and the upper surface of the ferromagnetic body 24B is partly exposed.

As shown in FIGS. 15A and 15B, the lower part of the opening 43 in the ferromagnetic body 24B and the insulator 23B is removed by the etching. The etching is, for example, the IBE. By the etching, the ferromagnetic bodies 24B are separated into the lower parts of each of the plurality of stacked structures comprising the hard mask 32, the conductor 31, the variable resistance material 26, and the conductor 25, resulting in the ferromagnetic bodies 24 being formed. Further, the insulator 23 is formed by the etching. The etching of the insulator 23 may reach the inside of the stacked body 22.

Next, the part 20b of the insulator 20 is further deposited on the entire surface of the structure of FIGS. 15A and 15B to obtain the structure of FIGS. 4A and 4B.

Advantage (Effect)

According to the first embodiment, a high performance storage device and an easier method for manufacturing a storage device can be provided as will be described below.

The memory cell disposed at an intersection point between the bit line and the word line similar to the storage device of the first embodiment may be formed through the following conventional process. First, as shown in FIGS. 16A and 16B, a conductor 121 that functions as the bit line BL is formed, and a stacked body 150 of a material of the plurality of layers that make up the memory cell is deposited on the conductor 121. The stacked body 150 contains, for example, the MTJ element and materials 122A, 123A, 124A, and 125A of a selector. The materials 122A, 123A, 124A, and 125A are processed into elements similar to the stacked body 22, the insulator 23, the ferromagnetic body 24, the conductor 25, and the variable resistance material 26, respectively. Next, the stacked body 150 is separated into a plurality of independent stacked bodies by the IBE. Each of the stacked bodies functions as one memory cell. Next, the word lines are formed on a plurality of stacked bodies aligned along the x axis.

However, in the manufacturing method, it is necessary to position the memory cell and the bit line and to position the memory cell and the word line. The positioning is extremely difficult because the memory cells, the bit lines, and the word lines are minute, and the relative positions of the memory cells, the bit lines, and the word lines can easily deviate from the intended positions.

Further, the IBE of the stacked body 150 is difficult. In other words, as shown in FIGS. 16A and 16B, for the IBE of the stacked body 150, a mask 141 is formed on the upper surface of a stacked body 150. The mask 141 has a thickness similar to the thickness of the stacked body 150. The ion beam of the IBE has an angle with respect to the z axis in order to prevent redeposition of the material removed from the stacked body 150 by the IBE on the stacked body 150. However, since an aspect ratio of the opening of the mask 141 is high, a shadowing effect may occur, that is, the ion beam having an angle with respect to z axis may fail to reach the lower portion of the stacked body 150. This makes processing by the IBE of the stacked body 150 difficult or impossible. When the area of the opening of the mask 141 is wide, the shadowing effect can be prevented, but the integration degree of the memory cell MC is low.

According to the first embodiment, each of the stacked bodies 22 has a linear shape on the xy plane and is jointly used by the memory cells MC, and each of the variable resistance materials 26 has a linear shape on the xy plane and is jointly used by the plurality of the memory cells MC. In other words, a stacked body 22 and a variable resistance material 26 are not provided for each memory cell MC. Therefore, a process for dividing the thick stacked body including the stacked body 22A and the variable resistance material 26A into parts for the respective memory cells, that is, a process shown in FIGS. 16A and 16B, is not necessary. Accordingly, the patterning of the stacked body by the IBE is easier than the example of FIGS. 16A and 16B, and there is no need to have a wide opening similar to the mask 141 in the process of FIGS. 16A and 16B. This makes it possible to increase the integration degree of the memory cell MC of the storage device 1.

Even when the stacked body 22 and the variable resistance material 26 are commonly used by the plurality of memory cells MC, the ferromagnetic body 24 is independent for each memory cell MC. Since the tunnel magnetoresistive effect in the memory cell MC depends on the direction of the magnetization of the ferromagnetic body 24, even when the stacked body 22 and the variable resistance material 26 are not independent for each memory cell MC, each of the memory cells MC can exhibit the tunnel magnetoresistive effect so as to be able to store data.

Further, the stacked body 22 has a linear shape. Therefore, the number of stacked bodies 22 required for a certain number of memory cells MC is smaller than that in a case where the stacked body 22 is provided for each memory cell. Generally, since the magnetic body generates a magnetic field from the edge thereof, when the number of stacked bodies 22 is small, the number of edges of the stacked body 22 is also small. Accordingly, the strength of a leakage magnetic field from the stacked body 22 of the first embodiment is weaker than that in a case where the stacked body 22 is provided for each memory cell. This makes it possible to provide the storage device 1 that can further stabilize the magnetization of the ferromagnetic body such as the ferromagnetic body 24, and can hold the data more stably.

Further, the conductor 222 in the stacked body 22 has a larger volume than that in a case where the stacked body 22 is provided for each memory cell. Therefore, the stacked body 22 can more strongly antiferromagnetically couple the ferromagnetic body 221 and the ferromagnetic body 223 to each other than a case where the stacked body 22 is provided for each memory cell MC. This makes it possible to provide the storage device 1 that further stabilizes the magnetization of the stacked body 22, and can hold the data more stably.

Further, the stacked body 22 having a linear shape may be formed in a process in common with the process for patterning the conductor 21A, and the linear variable resistance material 26 may be formed in a process in common with the process for patterning the conductor 31A. Therefore, the stacked body 22 and the variable resistance material 26 can be efficiently formed.

Further, the ferromagnetic body 24 is formed by patterning the ferromagnetic body 24A in a process in common with the formation of the conductor 21 and in a process in common with the formation of the conductor 31. Therefore, each of the ferromagnetic bodies 24 is formed in a self aligning manner at the intersection point of one conductor 21 and one conductor 31. Therefore, unlike a case where the ferromagnetic body 24 is formed in a process independent from the patterning of the conductors 21 and 31 as in the process of FIGS. 16A and 16B, the ferromagnetic body 24 is prevented from deviating from the intersection point of the conductors 21 and 31. This makes it possible to prevent a failure of electrical contact between each of the ferromagnetic bodies 24 and the corresponding conductors 21 and 31, and to provide a higher performance storage device 1.

Further, the ferromagnetic body 24 is formed by the patterning in a process in common with the formation of the conductor 21 and by the patterning in a process in common with the formation of the conductor 31. Therefore, for example, a dedicated patterning process for separating the stacked body 150 for each memory cell as in the process in FIGS. 16A and 16B, or a process for exposing the mask 141, is not necessary. Accordingly, the storage device 1 can be formed with fewer exposing processes than a case of the manufacturing method including the process of FIGS. 16A and 16B.

Second Embodiment

The second embodiment is different from the first embodiment in the structure of the memory cell array 11. Hereinafter, points different from those of the first embodiment will be mainly described.

Figure 17:
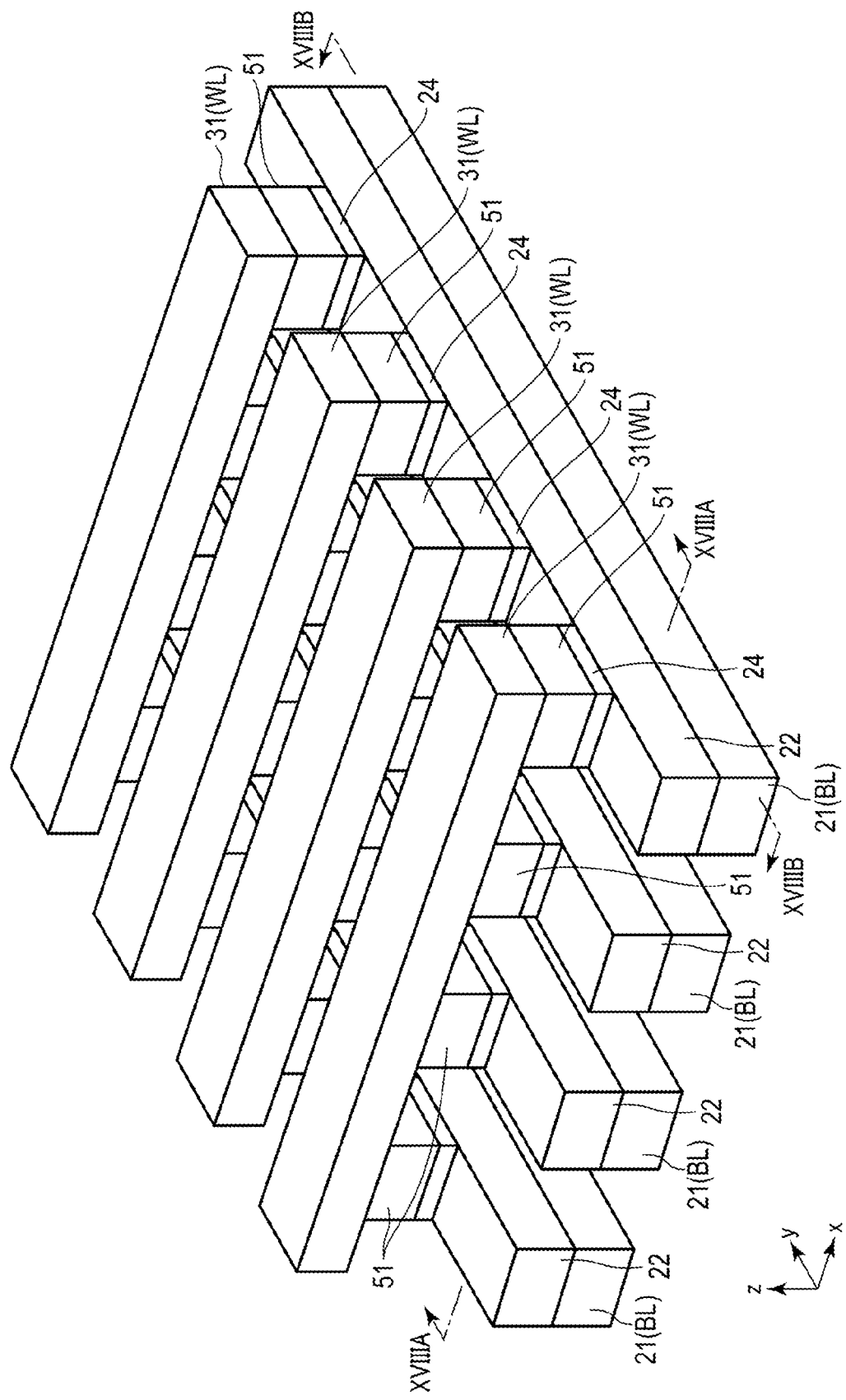
FIG. 17 is a perspective view of a schematic structure of a part of a memory cell array according to a second embodiment.
Figure 18A:
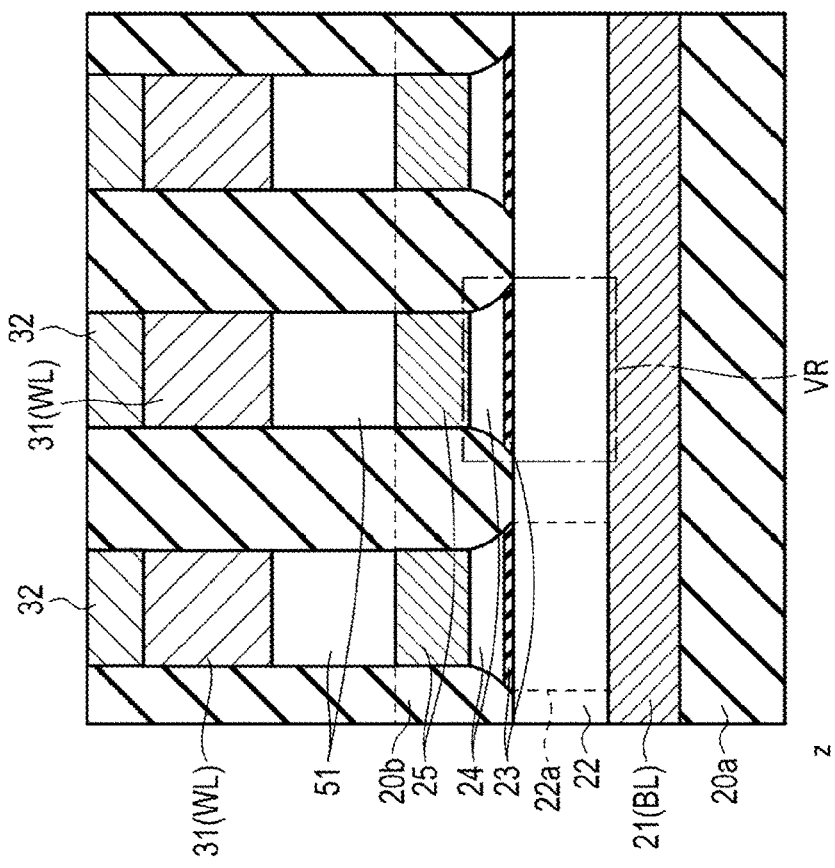
FIGS. 18A and 18B show cross-sectional structures of a part of the memory cell array according to the second embodiment.
Figure 18B:
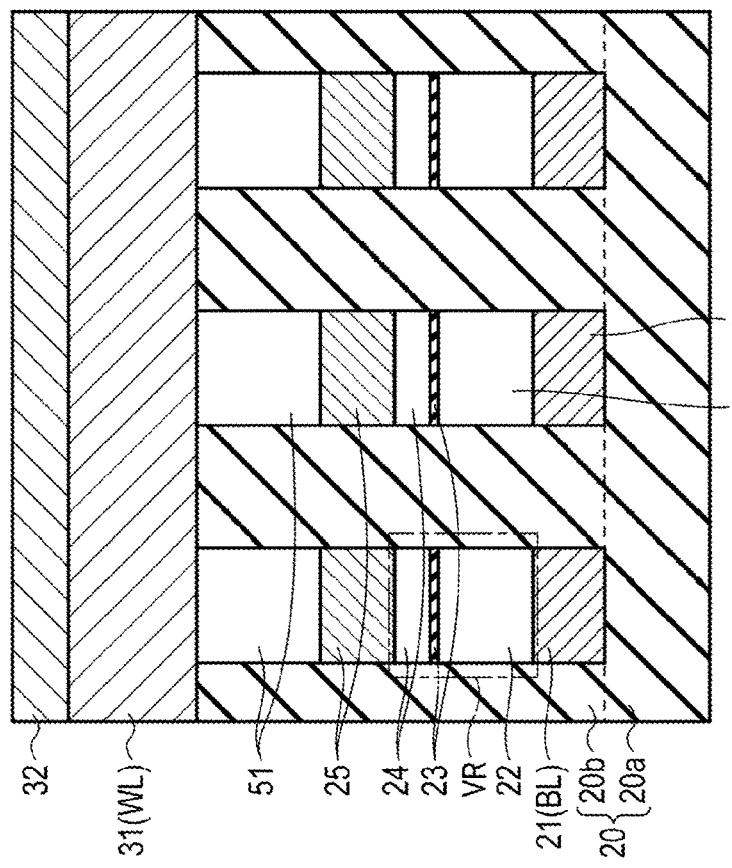

FIG. 17 is a perspective view of a schematic structure of a part of the memory cell array 11 according to the second embodiment. In FIG. 17, several elements are not shown or shown in a simplified manner. FIG. 18A shows a structure of a part of a section taken along line XVIIIA-XVIIIA in FIG. 17, and FIG. 18B shows a structure of a part of a section taken along line XVIIIB-XVIIIB in FIG. 17.

As shown in FIGS. 17 and 18, the memory cell array 11 does not include the variable resistance material 26 of the first embodiment (FIGS. 3 and 4), but includes a variable resistance material 51. Each of the variable resistance materials 51 is provided on the upper surface of one conductor 25, while the variable resistance materials 26 are provided on the upper surfaces of the plurality of conductors 25 arranged along the x axis. Accordingly, the variable resistance materials 51 are arranged along the x axis and the y axis.

Each of the conductors 31 is provided on the upper surfaces of the plurality of variable resistance materials 51 arranged along the x axis.

FIGS. 19A to 27B show a state during the manufacturing process of the storage device 1 according to the second embodiment in order. Each of FIGS. 19A, 20A, 21A, 22A, 23A, 24A, 25A, 26A, and 27A shows structures of a part of the section taken along line XVIIIA-XVIIIA in FIGS. 18A and 18B, and each of FIGS. 19B, 20B, 21B, 22B, 23B, 24B, 25B, 26B, and 27B shows structures of a part of the section taken along line XVIIIB-XVIIIB in FIGS. 18A and 18B. The processes of FIGS. 19A to 27B are similar to the processes of FIGS. 7 to 15 of the first embodiment, respectively.

As shown in FIGS. 19A and 19B, the conductor 21A, the stacked body 22A, the insulator 23A, the ferromagnetic body 24A, the conductor 25A, and a variable resistance material 51A are deposited in this order on the upper surface of the part 20a of the insulator 20. The variable resistance material 51A includes substantially the same material as the variable resistance material 51. Next, a hard mask 52 is formed on the upper surface of the variable resistance material 51A. The hard mask 52 has a pattern that remains above a region where the stacked structure of the conductor 21, the stacked body 22, the insulator 23, and the ferromagnetic body 24 is to be formed and is open at other parts. In other words, the pattern of the hard mask 52 has a linear shape that extends along the y axis and has intervals along the x axis.

As shown in FIGS. 20A and 20B, the conductor 21A, the stacked body 22A, the insulator 23A, the ferromagnetic body 24A, the conductor 25A, and the variable resistance material 51A are partly removed by etching using the hard mask 52 as a mask. The etching may be the RIE or the IBE. By the etching, the conductor 21, the stacked body 22, the insulator 23B, the ferromagnetic body 24B, the conductor 25B, and a variable resistance material 51B are formed. The variable resistance material 51B extends along the y axis and is arranged at intervals along the x axis. Other characteristics related to FIGS. 20A and 20B, are found in the description for FIGS. 8A and 8B.

Figure 21A:
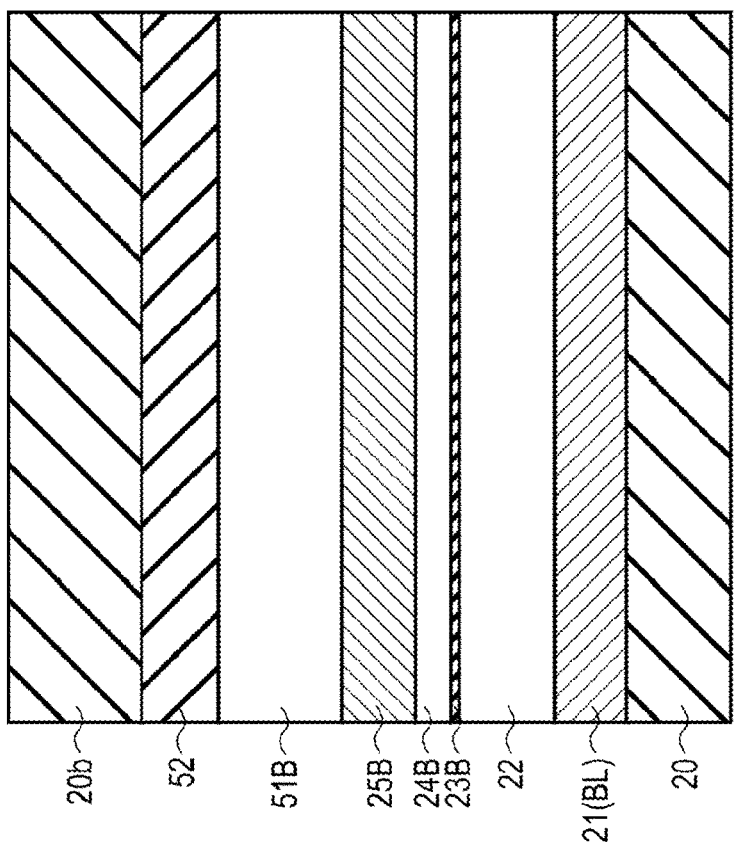
Figure 21B:
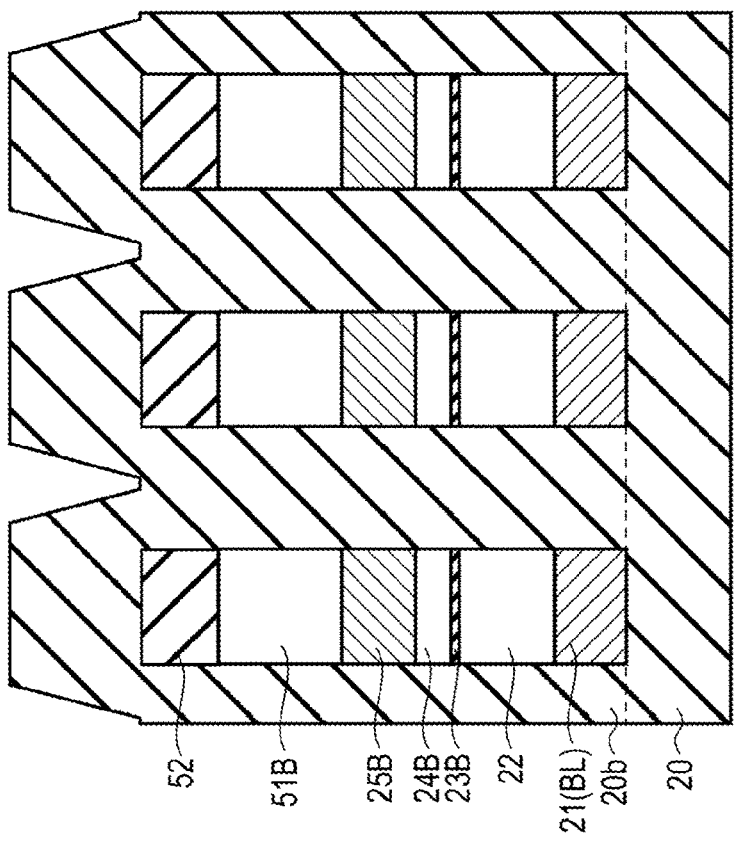

As shown in FIGS. 21A and 21B, the part 20b of the insulator 20 is deposited on the entire surface of the structure shown in FIGS. 20A and 2B. The part 20b of the insulator 20 fills in the region between the stacked structures including the conductor 21, the stacked body 22, the insulator 23B, the ferromagnetic body 24B, the conductor 25B, and the variable resistance material 51B.

As shown in FIGS. 22A and 22B, the upper portion of the part 20b of the insulator 20 and the hard mask 52 are removed by the CMP, for example. For example, the CMP is stopped at the height of the upper surface of the variable resistance material 51B with the upper surface of the variable resistance material 51B as a stopper.

As shown in FIGS. 23A and 23B, the conductors 31A are deposited on the entire surface on the upper surface of the variable resistance material 51B and the upper surface of the insulator 20b.

As illustrated in FIGS. 24A and 24B, a hard mask 54 is formed on the upper surface of the conductor 31A. The hard mask 54 remains above a region where the conductor 31 is to be formed and has an opening 55 at other parts. In other words, the pattern of the hard mask 54 has a linear shape that extends along the x axis and has intervals along the y axis. The hard mask 54 includes substantially the same material as the hard mask 32.

As shown in FIGS. 25A and 25B, similarly to FIGS. 13A and 13B, by the etching using the hard mask 54 as a mask, the conductor 31A and the variable resistance material 51B are partly etched, and a lower part of the opening 55 and an part above the conductor 25B of the insulator 20b are removed. The etching may be the RIE or the IBE. The etching is stopped at the height of the upper surface of the conductor 25B. As a result of the etching, the lower part of the opening 55 on the upper surface of the conductor 25B is exposed. For example, the RIE may be used to stop the etching on the upper surface of the conductor 25B. By the etching, the variable resistance material 51 and the conductor 31 are formed. Other characteristics related to FIGS. 25A and 25B are described in the description for FIGS. 13A and 13B.

As shown in FIGS. 26A and 26B, similar to FIGS. 14A and 14B, the lower part of the opening 55 in the conductor 25B is removed. As a result of the removal, the conductor 25 is formed, and the upper surface of the ferromagnetic body 24B is partly exposed. Other characteristics related to FIGS. 26A and 26B are described in the description for FIGS. 14A and 14B.

As shown in FIGS. 27A and 27B, similarly to FIGS. 15A and 15B, the ferromagnetic body 24B and the insulator 23B are partly removed by the etching. As a result, the ferromagnetic body 24 and the insulator 23 are formed.

Next, as the part 20b of the insulator 20 is further deposited on the entire surface of the structure of FIGS. 27A and 27B, the structure of FIGS. 18A and 18B is obtained.

According to the second embodiment, similar to the first embodiment, each of the stacked bodies 22 has a linear shape in the xy plane and is jointly used by the plurality of memory cells MC, and a stacked body 22 is not separately provided for each one of the memory cells MC. Therefore, similar to the first embodiment, a process for dividing the thick stacked body including the stacked body 22A and the variable resistance material 26A into parts for the respective memory cells, that is, a process shown in FIGS. 16A and 16B, is not necessary.

Further, similar to the first embodiment, the stacked body 22 has a linear shape. Therefore, similar to the first embodiment, the storage device 1 that can hold the data more stably can be provided.

Further, the stacked body 22 having a linear shape may be formed in a process in common with the process for patterning the conductor 21A. Therefore, the stacked body 22 can be efficiently formed.

Further, the ferromagnetic body 24 and the variable resistance material 51 are formed by patterning the ferromagnetic body 24A and the variable resistance material 51A in a process in common with the formation of the conductor 21 and in a process in common with the formation of the conductor 31. Therefore, each of the ferromagnetic bodies 24 and the variable resistance materials 51 is formed in a self-aligning manner at the intersection point of one conductor 21 and one conductor 31. Therefore, unlike a case where the ferromagnetic body 24 and the variable resistance material 51 are formed in a process independent from the patterning of the conductors 21 and 31, for example, a case in FIGS. 16A and 16B, a set of the ferromagnetic body 24 and the variable resistance material 51 are prevented from deviating from the intersection point of the conductors 21 and 31. This makes it possible to prevent a failure of electric contact between the conductors 21 and 31 and the corresponding set of the ferromagnetic body 24 and the variable resistance material 51, and to provide the higher performance storage device 1.

Further, the ferromagnetic body 24A and the variable resistance material 51 are formed by the patterning in a process in common with the formation of the conductor 21 and by the patterning in a process in common with the formation of the conductor 31. Therefore, for example, a dedicated patterning process for separating the stacked body 150 for each memory cell as in the process in FIGS. 16A and 16B, or a process for exposing the mask 141 for the purpose, is not necessary. Accordingly, the storage device 1 can be formed with fewer exposing processes than a case of the manufacturing method including the process of FIGS. 16A and 16B.

Modification Example

Figure 28:
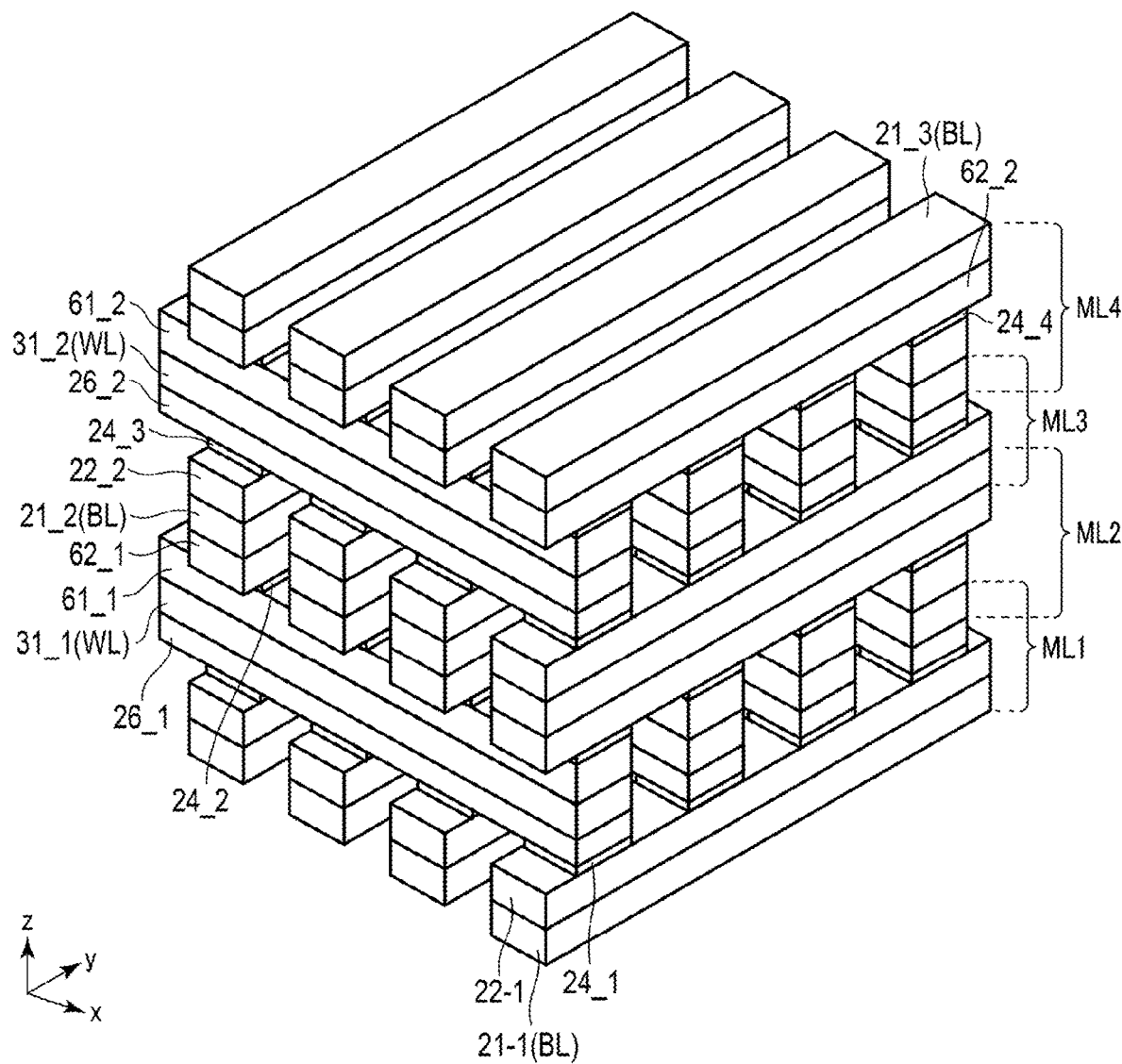
FIG. 28 is a perspective view of a schematic structure of a part of a memory cell array according to a modification example of a second embodiment.

The structure of FIG. 17 may be repeatedly provided along the z axis. FIG. 28 shows such an example, and is a perspective view of a schematic structure of a part of the memory cell array 11 according to the modification example of the first embodiment. In FIG. 28, similar to FIG. 3, several elements are not shown or shown being simplified.

A conductor 21_1, a stacked body 22_1, a ferromagnetic body 24_1, a variable resistance material 26_1, and a conductor 31_1 in FIG. 28 correspond to the conductor 21, the stacked body 22, the ferromagnetic body 24, the variable resistance material 26, and the conductor 31, respectively in FIG. 3. In the following description, elements indicated by reference numerals including certain numbers and underbars are used for distinguishing the elements to which the reference numerals are given without underbars and the elements which have the same or similar characteristics and to which the reference numerals are given without underbars.

The layers of the conductor 21_1, the stacked body 22_1, the ferromagnetic body 24_1, the variable resistance material 26_1, and the conductor 31_1 configure a first memory layer ML1. Each of the first memory layer ML1 to a fourth memory layer ML4, including the second memory layer ML2, the third memory layer ML3, and the fourth memory layer ML4 which will be described later, configures one unit structure. In other words, in each of the first to fourth memory layers ML1 to ML4, a plurality of word lines WL, a plurality of bit lines BL, and a structure in which one memory cell MC is connected between each of the plurality of word lines WL and the plurality of bit lines BL, is formed.

Stacked bodies 61_1 are provided on the upper surfaces of each of the conductors 31_1. The stacked body 61_1 extend along the x axis and are arranged along the y axis. The stacked body 61_1 includes layers having the same characteristics and functions as those of the layers in the stacked body 22. In other words, the stacked body 61 includes a ferromagnetic body 611 (not illustrated), a conductor 612 (not illustrated), and a ferromagnetic body 613 (not illustrated). The ferromagnetic body 611, the conductor 612, and the ferromagnetic body 613 contain the same material as that of the ferromagnetic body 221, the conductor 222, and the ferromagnetic body 223, respectively.

A plurality of ferromagnetic bodies 24_2 are provided on the upper surfaces of each of the stacked bodies 61_1. Variable resistance materials 62_1 are provided on the upper surfaces of each of the plurality of ferromagnetic bodies 24_2 arranged along the y axis. The variable resistance materials 62_1 extend along the y axis and are arranged at intervals along the x axis. The variable resistance material 62_1 contains the same material as that of the variable resistance material 26.

Conductors 21_2 are provided on the upper surfaces of each of the variable resistance materials 62_1. The conductors 21_2 extend along the y axis and are arranged at intervals along the x axis.

The conductor 31_1, the stacked body 61_1, the ferromagnetic body 24_2, the variable resistance material 62_1, and the conductor 21_2 make up the second memory layer ML2.

The third memory layer ML3 including the conductor 21_2 is provided. The third memory layer ML3 includes the conductor 21_2, a stacked body 22_2, a ferromagnetic body 24_3, a variable resistance material 26_2, and a conductor 31_2. The third memory layer ML3 has the same structure as that of the first memory layer ML1.

The fourth memory layer ML4 including the conductor 31_2 is provided. The fourth memory layer ML4 includes the conductor 31_2, a stacked body 61_2, a ferromagnetic body 24_4, a variable resistance material 62_2, and a conductor 21_3. The fourth memory layer ML4 has the same structure as that of the second memory layer ML2.

More memory layers may also be provided by extending the structure described so far. For example, the (2k+1)-th memory layer (k is a natural number equal to or greater than 2) uses a conductor jointly with the (2k)-th memory layer, and has the same structure as that of the first memory layer ML1. Further, the (2k+2)-th memory cell uses a conductor jointly with the (2k+1)-th memory layer, and has the same structure as that of the second memory layer ML2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a first conductor that extends in a first direction;
   a first stacked body that extends in the first direction, is disposed on the first conductor to be electrically connected thereto, and includes a first ferromagnetic body that extends in the first direction;
   a first switching element having a first end and a second end and extending in a second direction crossing the first direction, the first switching element regulating current flow between the first end and the second end in response to a voltage applied between the first end and the second end;
   a second conductor that extends in the second direction and is disposed on the first switching element to be electrically connected to the second end of the first switching element;
   a second ferromagnetic body between the first switching element and the first stacked body;
   a first insulator between the first stacked body and the second ferromagnetic body;
   a third conductor that extends in the first direction in parallel to the first conductor;
   a second stacked body that extends in the first direction and is disposed on the third conductor to be electrically connected thereto;
   a third ferromagnetic body between the first switching element and the second stacked body; and
   a second insulator between the second stacked body and the third ferromagnetic body.

2. The storage device according to claim 1,
   wherein the first stacked body includes
      a fourth conductor that extends in the first direction and is electrically connected to the first ferromagnetic body, and
      a fourth ferromagnetic body that extends in the first direction and is electrically connected to the fourth conductor.

3. The storage device according to claim 1,
   wherein the first stacked body is above the first conductor,
   wherein the first insulator is above the first stacked body,
   wherein the second ferromagnetic body is above the first insulator,
   wherein the first switching element is above the second ferromagnetic body, and
   wherein the second conductor is above the first switching element.

4. The storage device according to claim 1,
   wherein the first switching element includes a variable resistance material that extends in the second direction.

5. The storage device according to claim 4, wherein the variable resistance material
   interrupts the current flow from the first end to the second end when a voltage less than a first threshold voltage is applied across the first end to the second end,
   allows the current to flow from the first end to the second end when a voltage equal to or greater than the first threshold voltage is applied across the first end to the second end,
   interrupts the current flow from the second end to the first end when a voltage less than a second threshold voltage is applied across the second end to the first end, and
   allows the current to flow from the second end to the first end when a voltage equal to or greater than the second threshold voltage is applied across the second end to the first end.

6. The storage device according to claim 1, further comprising:
   a second switching element having a third end and a fourth end and extending in the second direction,
   the second switching element regulating current flow between the third end and the fourth end in response to a voltage applied between the third end and the fourth end; and
   a fifth conductor that extends in the second direction and is disposed on the first switching element to be electrically connected to the fourth end of the second switching element;
   a fifth ferromagnetic body between the second switching element and the first stacked body;
   a third insulator between the first stacked body and the fifth ferromagnetic body;
   a sixth ferromagnetic body between the second switching element and the second stacked body; and
   a fourth insulator between the second stacked body and the sixth ferromagnetic body.

7. A storage device comprising:
   a plurality of first conductors extending in a first direction and spaced apart in a second direction crossing the first direction;

a plurality of stacked bodies that extend in the first direction, are respectively disposed on the plurality of first conductors to be electrically connected thereto, and respectively include a first ferromagnetic body that extends in the first direction;

a plurality of switching elements extending in the second direction and spaced apart in the first direction, each of the switching elements having a first end and a second end, and regulating current flow between the first end and the second end in response to a voltage applied between the first end and the second end;

a plurality of second conductors that extend in the second direction and are respectively disposed on the plurality of switching elements to be electrically connected to the second end thereof;

a plurality of second ferromagnetic bodies, each of which is between one of the switching elements and one of the stacked bodies; and a plurality of insulators, each of which is between one of the stacked bodies and one of the second ferromagnetic bodies.

8. The storage device according to claim 7, wherein each of the stacked bodies includes
a third conductor that extends in the first direction and is electrically connected to one of the first ferromagnetic bodies, and
a third ferromagnetic body that extends in the first direction and is electrically connected to the third conductor.

9. The storage device according to claim 7, wherein each of the switching elements includes a variable resistance material that extends in the second direction.

10. The storage device according to claim 9, wherein the variable resistance material
interrupts the current flow from the first end to the second end when a voltage less than a first threshold voltage is applied across the first end to the second end,
allows the current to flow from the first end to the second end when a voltage equal to or greater than the first threshold voltage is applied across the first end to the second end,
interrupts the current flow from the second end to the first end when a voltage less than a second threshold voltage is applied across the second end to the first end, and
allows the current to flow from the second end to the first end when a voltage equal to or greater than the second threshold voltage is applied across the second end to the first end.

* * * * *